United States Patent [19]
Kaida et al.

[11] Patent Number: 5,717,365
[45] Date of Patent: Feb. 10, 1998

[54] RESONATOR AND RESONANT COMPONENT UTILIZING WIDTH VIBRATION MODE

[75] Inventors: Hiroaki Kaida, Tonami; Makoto Irie, Toyama, both of Japan

[73] Assignee: Murata Manufacturing Co., Ltd., Japan

[21] Appl. No.: 630,890

[22] Filed: Apr. 2, 1996

[30] Foreign Application Priority Data

Apr. 11, 1995 [JP] Japan .................. 7-085349

[51] Int. Cl.⁶ .................................................. H03H 9/00
[52] U.S. Cl. ........................ 333/187; 310/348; 310/367
[58] Field of Search ............................ 333/186–192; 310/348, 367

[56] References Cited

U.S. PATENT DOCUMENTS

| | | | |
|---|---|---|---|
| 3,891,872 | 6/1975 | Nagata et al. | 333/187 |
| 4,511,202 | 4/1985 | Kasai | 333/187 |
| 5,084,647 | 1/1992 | Inoue et al. | 333/187 |
| 5,548,179 | 8/1996 | Kaida | 333/187 |

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A piezoelectric resonator adapted for use in the band from several hundreds of kilohertz to 2 MHz utilizes a newly discovered width vibration mode and permits use of a simplified support structure which reduces stress on the resonator and reduces the overall size of the resonator. The resonator has a substantially rectangular cross-sectional shape having a pair of shorter sides and a pair of longer sides. To achieve the newly discovered vibration mode, the ratio of the length b of the longer sides to the length a of the shorter sides is set to be within ±10% of a value given by $$b/a = n(-2.70\sigma + 2.86)$$

where n is an integer and σ is the Poisson's ratio of the ymaterial used to form the resonator.

14 Claims, 26 Drawing Sheets

RESONATOR AND RESONANT COMPONENT UTILIZING WIDTH VIBRATION MODE

BACKGROUND OF THE INVENTION

1. Field of the Invention

The present invention relates to a resonator and a resonant component having a substantially rectangular cross section and utilizing a certain width vibration mode and, more particularly, to a resonator and a resonant component which can be used in various applications such as piezoelectric resonators, single-mode piezoelectric filters, double-mode piezoelectric filters, and ladder-type filters.

2. Description of the Related Art

In general, a piezoelectric resonator having a piezoelectric body in the form of a flat plate such as a square plate and utilizing an expansion vibration mode or a contour shear vibration mode is used in the frequency range of several 10 kHz to 2 MHz.

When either of the above-described modes of vibration is used, only the central point on the principal plane of the piezoelectric resonator is a nodal point. This results in difficulty in holding the piezoelectric resonator stably. In a piezoelectric resonator constructed as described above, it is therefore common practice to hold the piezoelectric resonator using resilient spring terminals disposed in contact with the nodal point.

However, such a holding arrangement causes stress to be concentrated at the points at which the resonator contacts the spring terminals. As a result, there arises the possibility that the stress causes the piezoelectric resonator to crack.

Furthermore, it is difficult to use a holding structure other than the aforementioned holding structure having the spring terminals, because the nodal point of the vibration is located in the center of the principal plane of the resonator. In addition, it is difficult to reduce the size of a component having the piezoelectric resonator supported by spring terminals.

SUMMARY OF THE INVENTION

The preferred embodiments of the present invention provide a resonator and a resonant component which are adapted for use in a wide frequency range from several 100 kHz to 2 MHz or in a wider band, are adapted to be held by a support structure that is simplified compared to conventional support structures, eliminate stress concentration caused by the support structure, and allow for substantially reducing the size of the entire structure.

In order to achieve the above-described advantages, according to the preferred embodiments of the present invention, a resonator utilizes a newly discovered width vibration mode and includes a resonating portion having a substantially rectangular cross section. The substantially rectangular cross section includes a pair of shorter sides each having a length a and a pair of longer sides each having a length b and the ratio of the length of the longer sides to the length of the shorter sides, i.e., b/a, is preferably set to be within ±10% of the value satisfying the relation $$b/a = n(-2.70\sigma + 2.86) \tag{1}$$

where n is an integer and σ is the Poisson ratio of the material used to form the resonator.

More specifically, the resonator is characterized in that the dimensions of the resonating portion and the Poisson ratio of the material of the resonator satisfy the above-described relationship. As can be seen from the description of the preferred embodiments of the invention, a certain width vibration mode in which the whole region interconnecting substantially central portions of the longer side surfaces becomes a node of the vibration is excited when the relationship b/a described above is satisfied.

Accordingly, even if the resonator is held at the above-described node of vibration, the resonant characteristics of the resonator do not degrade. Examples of structure for holding the resonator at this node of vibration include support members, metal terminals, and so on, the holding structure being coupled to the outer surface of the region interconnecting substantially the centers of the longer side surfaces.

In one aspect of the preferred embodiments of the present invention, the resonating portion of substantially rectangular cross section includes a piezoelectric body and a piezoelectric resonating portion having a plurality of resonant electrodes formed on the outer surface of the piezoelectric body. Examples of the material of the piezoelectric body include ceramics (e.g., piezoelectric ceramics of lead zirconate titanate) and single crystals of piezoelectric substances such as quartz and $LiTaO_3$. In the case of a piezoelectric ceramic, the piezoelectric body is polarized in a direction perpendicular or parallel to the substantially rectangular cross section.

The resonant electrodes are preferably disposed on the outer surface of the piezoelectric body which outer surface extends parallel or perpendicular to the substantially rectangular cross section.

In the case where the above-described piezoelectric resonating portion is used, the direction of polarization of the piezoelectric body and the positions at which the resonant electrodes are located are selected so that either a longitudinal piezoelectric effect or a transverse piezoelectric effect can be utilized. As can be understood from the description of the preferred embodiments of the present invention, the inventive piezoelectric resonator may make use of either a longitudinal piezoelectric effect or a transverse piezoelectric effect.

In another aspect of the preferred embodiments of the present invention, the resonator utilizing the above-described certain width vibration mode further includes support members coupled at least substantially to the center of one of the longer side surfaces of the resonating portion. In the novel resonator vibrating under the certain width mode, the node of vibration exists along an entire region interconnecting substantially the centers of the longer side surfaces. Therefore, the resonator can be supported without hindering the vibration in the certain width vibration mode by coupling the support members substantially to the centers of the longer side surfaces. Consequently, the resonator can be held without affecting the vibration of the resonating portion, by firmly holding the support members via separate members. In this way, a resonant component can be readily built by affixing the support members to case bases, case members, or the like.

In a further aspect of the preferred embodiments of the present invention, a chip-type piezoelectric resonant component utilizing a certain width vibration mode is provided. This resonant component comprises the novel resonator equipped with the above-described support members, case bases bonded to the top and bottom, respectively, of the resonator, and at least one space-forming member for defining spaces to prevent vibration of the vibrating portions of the resonator from being hindered. The space-forming member is preferably located in the case bases or between the case bases and the resonator.

Preferably, the above-described chip-type piezoelectric resonant component further comprises first and second spacer plates. The spacer plates are preferably rigidly mounted to the support members of the resonator. The spacer plates cooperate with the resonator to form a frame-like resonant plate centrally provided with an opening. The resonating portion of the resonator is positioned in the central opening formed in the frame-like resonant plate which is formed by the resonator and by the two spacer plates. The case bases are bonded to the top and bottom, respectively, of the resonant plate. In this manner, a chip-type piezoelectric resonant component in which the resonating portion is sealed is completed.

The novel resonator and resonant component are not limited to resonators utilizing a so-called single resonant characteristic and components using such resonators. The preferred embodiments of the present invention can also be applied to filters making use of plural resonant characteristics.

In still another aspect of the preferred embodiments of the present invention, the above-described piezoelectric resonant portion includes first and second piezoelectric resonant portions equipped with support members connected substantially to the center of one of the longer side surfaces. Substantially central portions of the other side surfaces of the first and second piezoelectric resonant portions are connected together by connector members. First and second resonant electrodes are disposed on the top surfaces, respectively, of the first and second piezoelectric resonant portions. A common resonant electrode is located on the bottom surfaces of the first and second piezoelectric resonant portions so as to overlap the first and second resonant electrodes via a piezoelectric body. In this way, a double-mode piezoelectric filter is provided.

Preferably, the above-described double-mode piezoelectric filter further comprises first and second spacer plates and case bases. The spacer plates are preferably rigidly mounted to the support members of the resonator. The spacer plates cooperate with the resonator to form a frame-like resonant plate provided with a substantially centrally located opening. The case bases are preferably bonded to the top and bottom, respectively, of the resonant plate. The first and second piezoelectric resonant portions are positioned in the substantially central opening in the frame-like resonant plate which is formed by the resonator and by the first and second spacer plates. The case bases are bonded to the top and bottom, respectively, of the resonant plate. In this manner, the above-described double-mode piezoelectric filter acts as a chip-type piezoelectric resonant component into which the first and second piezoelectric resonant portions are built.

In an additional aspect of the preferred embodiments of the present invention, a resonator constructed as a single-mode piezoelectric filter having the above-described piezoelectric resonating portion is provided. In this structure, the piezoelectric resonating portion comprises a piezoelectric plate, first and second resonant electrodes disposed along the edges of the longer sides on the top surface of the piezoelectric plate, and a common resonant plate formed on the bottom surface of the piezoelectric plate so as to overlap the first and second resonant electrodes via the piezoelectric plate.

Preferably, the above-described single-mode piezoelectric filter comprises a base plate, a resonator forming the aforementioned single-mode piezoelectric filter, a plurality of metal terminals, and a capping member mounted to the base plate so as to surround the resonator mounted on the base plate. A plurality of connector electrodes for connection with external components are disposed on the top surface of the base plate. The resonator is disposed on the base plate in such a way that one of the longer side surfaces is directed downwardly. The metal terminals act to electrically connect the first and second resonant electrodes and the common resonating electrode of the resonator with the connector electrodes. The metal terminals further serve to mount the resonator on the base plate.

In a still further aspect of the preferred embodiments of the present invention, a ladder-type filter comprising at least one piezoelectric resonator forming a parallel arm and at least one series resonator forming a series arm is provided. This filter is characterized in that at least one of the series and parallel resonators is formed by the novel piezoelectric resonator. In another preferred embodiment, all of the series and parallel resonators are formed by piezoelectric resonators according to the preferred embodiments of the present invention.

The novel ladder-type filter is preferably built as a chip-type component constructed in the manner described below. When all of the series and parallel resonators are formed by piezoelectric resonators according to the preferred embodiments of the present invention, a base plate and a plurality of metal terminals are preferably added. The plural piezoelectric resonators forming these series and parallel resonators are preferably stacked on the base plate. The piezoelectric resonators are mounted to the base plate by the metal terminals. In this case, a plurality of connector electrodes for connection to external components are disposed on the top surface of the base plate. The metal terminals act to electrically connect the resonant electrodes of the piezoelectric resonators with the connector electrodes on the base plate so as to form a ladder-type filter. Furthermore, the metal terminals physically hold the piezoelectric resonators on the base plate. A cap is firmly mounted on the base plate so as to surround the piezoelectric resonators stacked on the base plate.

The aforementioned metal terminals are coupled to the piezoelectric resonators in the region interconnecting the centers of the longer side surfaces of the piezoelectric resonators.

In a yet other aspect of the preferred embodiments of the present invention, a ladder-type filter comprising at least one piezoelectric resonator forming a parallel arm and at least one series resonator forming a series arm is provided. This filter is characterized in that at least one of the series and parallel resonators is formed by the novel piezoelectric resonator where support members are coupled substantially to the centers of the longer side surfaces. Also in this case, all of the series and parallel resonators may be formed by the above-described piezoelectric resonators.

When all of the series and parallel resonators are formed by the inventive piezoelectric resonators having the above-described support members, a chip-type ladder-type filter constructed in the manner described below is provided. First and second spacer plates mounted to the support members of the piezoelectric resonators forming the series and parallel resonators are further provided. The spacer plates cooperate with the piezoelectric resonators to form a frame-like resonant plate provided with a substantially central opening. Since the piezoelectric resonators cooperate with the first and second spacer plates to form the frame-like resonant plate, the piezoelectric resonating portions of the piezoelectric resonators are positioned in the central opening inside the resonant plate. The resonant plates incorporating the piezoelectric resonators are stacked in the direction of thickness, thus forming a lamination. Case bases are bonded to the top and bottom, respectively, of the lamination to define spaces to prevent the vibrating portions of the piezoelectric resonators from being hindered. In this case, at least one space-forming member is provided in the case bases or between each case base and the resonant plate to define the aforementioned spaces.

The aforementioned at least one space-forming member can be constituted by forming recesses in those surfaces of the case bases which are located on the sides of the stacked piezoelectric resonators. Alternatively, the at least one space-forming member is formed by arranging spacers having openings between each case base and each resonator to prevent vibration of the resonating portions from being hindered. The spacers can be made from a synthetic resin, a ceramic, or other appropriate material. The spacers may also be formed by applying a pressure-sensitive adhesive to rectangular portions on the case bases or on the resonant plate and curing the adhesive.

Other features and advantages of the present invention will become apparent from the following description of the preferred embodiments of the invention which refers to the accompanying drawings.

DETAILED DESCRIPTION OF PREFERRED EMBODIMENTS

Figure 1:
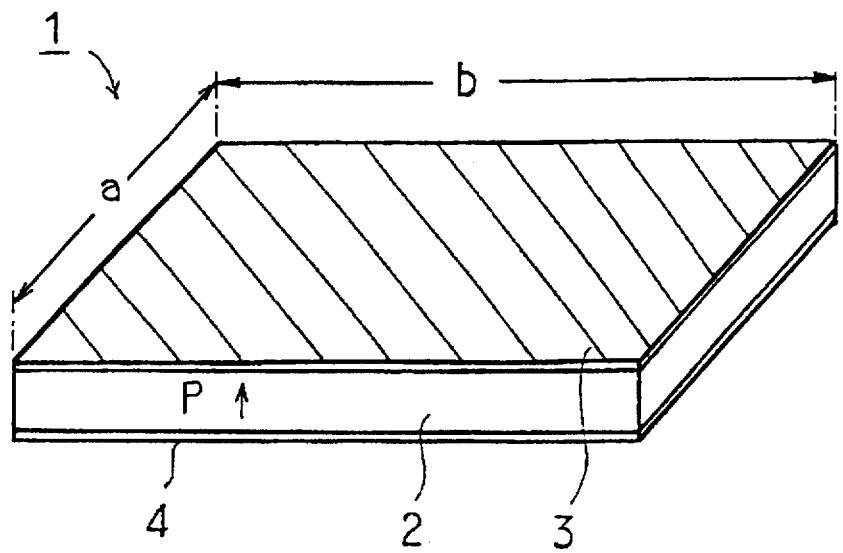
FIG. 1 is a respective view of a piezoelectric resonator according to the first preferred embodiment of the invention.

The preferred embodiments of the present invention are characterized in that resonating portions having longer sides of a length of a and shorter sides of a length of b are provided, and that b/a, i.e., the ratio of the length of the longer sides to the length of the shorter sides is preferably set to be within ±10% of the value satisfying the following equation:

$$b/a = n(-2.70\sigma + 2.86) \tag{1}$$

where n=1.

That is, all of resonators, chip-type piezoelectric resonant components, single-mode piezoelectric filters, double-mode piezoelectric filters, and ladder-type filters according to the preferred embodiments of the present invention preferably have the above-described resonating portions.

The inventors of the preferred embodiments of the present invention have earnestly investigated a resonator which has a support structure capable of being simplified easily and which is adapted for use in the frequency band from several hundreds of kilohertz to several megahertz. The inventors have discovered that the above-described advantages are achieved by selecting the ratio b/a to be within ±10% of the value satisfying Eq. (1) above.

Since the novel resonator has the above-described resonating portions, the resonator is excited in a newly discovered certain width vibration mode as can be seen from the description of the preferred embodiments of the invention. In a resonator adapted to vibrate in the certain width vibration mode, the node of vibration includes the whole region interconnecting substantially central portions of the longer side surfaces of the resonator. Accordingly, if the novel resonator is held in the region interconnecting the centers of the longer side surfaces, the resonant characteristics of the resonator are hardly affected. Furthermore, the resonant characteristics of this resonator range from several hundreds of kilohertz to several megahertz. Consequently, a resonator which has a simplified support structure and is adapted for use in the band from several hundreds of kilohertz to several megahertz can be provided.

In addition, since the node of vibration exists in the region interconnecting approximate centers of the longer side surfaces as mentioned previously, where the support member is connected substantially to the centers of the longer side surfaces, vibration of the resonating portions hardly leaks to the support members. Therefore, the resonator can be readily held by mounting the support members to case members or other members. That is, spring terminals or other complex support structures are not necessary. Accordingly, where a resonant component is formed, using the resonator, the number of parts can be reduced. Moreover, the size can be reduced.

Furthermore, a chip-type piezoelectric resonant component can be easily provided by bonding case bases to the top and bottom, respectively, of the novel resonator such that the resonator is sandwiched between the case bases. The novel chip-type piezoelectric resonant component does not need any complex support structure such as spring terminals. Consequently, miniaturization of the resonant component can be easily accomplished. In addition, the shock resistance can be improved.

In the novel double-mode piezoelectric filter, first and second piezoelectric resonating portions are formed by the novel resonating portions described above. Therefore, if the filter is supported substantially at the centers of the longer side surfaces of the piezoelectric resonating portions, the filter characteristics are hardly affected, similar to the novel piezoelectric filter described above. Hence, a small-sized double-mode piezoelectric filter which has simplified support structure and is adapted for use in the band from several hundreds of kilohertz to several megahertz can be provided.

In the aforementioned double-mode piezoelectric filter, if a substantially rectangular frame-like resonant plate is formed by a resonator and by first and second spacer plates, first and second piezoelectric resonating portions are positioned in the central opening inside the substantially rectangular frame-like resonant plate. A double-mode piezoelectric filter can be built as a chip-type component by bonding case bases to the top and bottom, respectively, of the resonant plate. The shock resistance of the double-mode piezoelectric filter can be enhanced because the case bases are bonded to the resonant plate.

Similarly, in the novel single-mode piezoelectric filter, first and second resonating portions are formed in the region where first and second resonant electrodes overlap the common resonant electrode. Therefore, if substantially central portions of the longer side surfaces of the piezoelectric plate are held, the filter characteristics are hardly affected. Consequently, a single-mode piezoelectric filter which has a simplified support structure and is adapted for use in the band from several hundreds of kilohertz to several megahertz can be provided.

Moreover, in the novel single-mode piezoelectric filter, a piezoelectric resonator can be supported by making use of the region interconnecting the substantially central portions of the longer side surfaces as described above. Consequently, a chip-type single-mode piezoelectric filter can be easily built by combining base plates, metal terminals, and a cap member.

In the novel ladder-type filter, at least one of a series resonator and a parallel resonator is formed by the novel piezoelectric resonator. The novel piezoelectric resonator can be supported substantially in the centers of the longer side surfaces as mentioned previously. Consequently, a ladder-type filter which has a simplified support structure and is adapted for use in the band from several hundreds of kilohertz to several megahertz can be provided. In a preferred embodiment of the present invention, where all of the series and parallel resonators are formed by piezoelectric resonators, all structures for supporting the piezoelectric resonator can be simplified. Where all the resonators of the ladder-type filter are composed of piezoelectric resonators according to another preferred embodiment of the present invention, a chip-type ladder-type filter can be easily built by combining base plates and metal terminals.

The novel ladder-type filter described above can also be constructed by using the novel piezoelectric resonators which are fabricated by connecting support members to the resonating portion. In this case, a resonant plate can be built by mounting first and second spacer plates on the piezoelectric resonators. Therefore, a chip-type ladder-type filter having excellent shock resistance can be readily fabricated by stacking resonant plates in a thickness direction of the resonator and bonding case bases to the lamination, each resonant plate incorporating a piezoelectric resonator forming series and parallel resonators.

Hereinafter, preferred embodiments of the present invention are explained in more detail referring to the drawings.

FIG. 1 is a perspective view of a piezoelectric resonator according to the first preferred embodiment of the invention. The piezoelectric resonator 1 includes a substantially rectangular piezoelectric plate 2 and resonant electrodes 3 and 4 disposed on respective top and bottom major surfaces of the piezoelectric plate 2. The piezoelectric plate 2 is preferably made from a piezoelectric ceramic including lead zirconate titanate having a Poisson ratio $\sigma=0.324$. The piezoelectric plate 2 is subjected to a treatment such that the piezoelectric plate 2 is polarized in the direction of thickness shown by arrow P, i.e., in the direction perpendicular to the principal plane of the piezoelectric plate 2. The piezoelectric plate 2 may also be made from other piezoelectric ceramic material, quartz, or a single crystal of a piezoelectric substance of $LiTaO_3$ or other suitable material.

The piezoelectric plate 2 forms a resonating portion having a substantially rectangular cross section parallel the principal plane thereof. That is, the substantially rectangular cross section is parallel to both the top and bottom surfaces of the piezoelectric plate 2. The substantially rectangular cross section has longer sides each having a length b and shorter sides each having a length a. The ratio b/a is preferably set to be within ±10% of the value satisfying the following equation (1):

$$b/a=n(-2.70\sigma+2.86) \quad (1)$$

where n=1.

Resonant electrodes 3 and 4 are preferably formed to extend over the entire area of the top and the bottom surfaces, respectively, of the piezoelectric plate 2. In the piezoelectric resonator 1, an AC voltage is applied across the resonant electrodes 3 and 4 to excite the piezoelectric resonator 1 in a newly discovered certain width mode described later.

Figure 2:
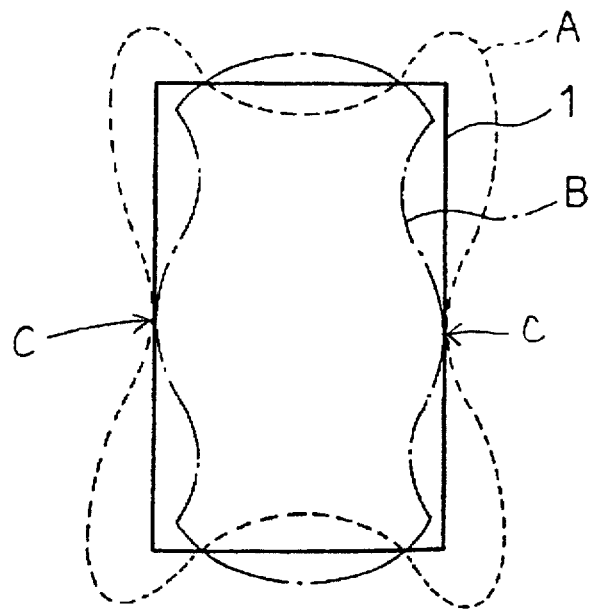
FIG. 2 is a schematic plan view, illustrating a certain width mode utilized by the preferred embodiments of the present invention.

The above-described certain width vibration mode is now described by referring to the schematic plan view of FIG. 2. When the piezoelectric resonator 1 is excited under the certain width mode, the resonator vibrates between the state indicated by the broken line A and the state indicated by the dot-and-dash line B. The certain width mode is excited strongly.

As can be seen from FIG. 2, under the aforementioned certain width vibration mode, substantially central points C of the longer sides surfaces of the piezoelectric resonator 1 form the node of the vibration.

Figure 4A:
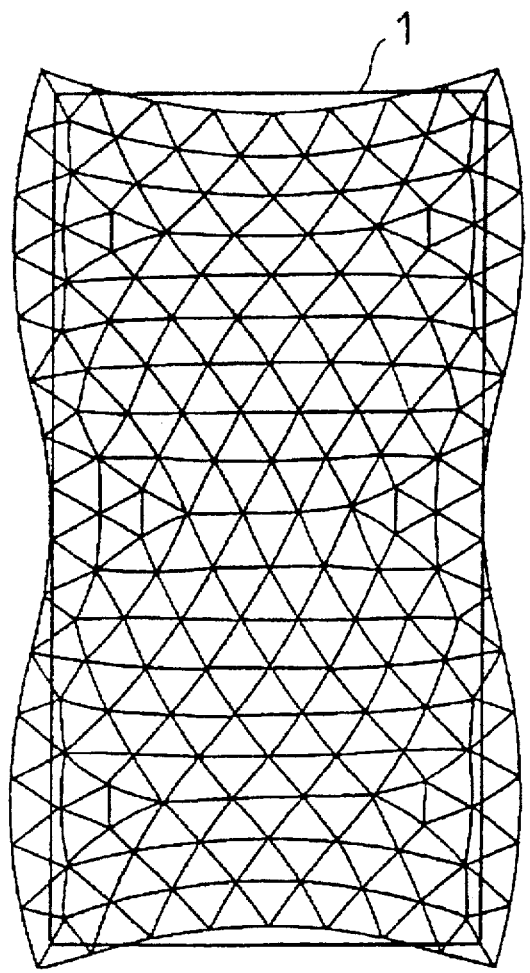
FIG. 4(a) is a diagram showing the displacement distribution in the certain width vibration mode according to the preferred embodiments of the present invention, the distribution being obtained by an analysis made by utilizing the finite element method.
Figure 4B:
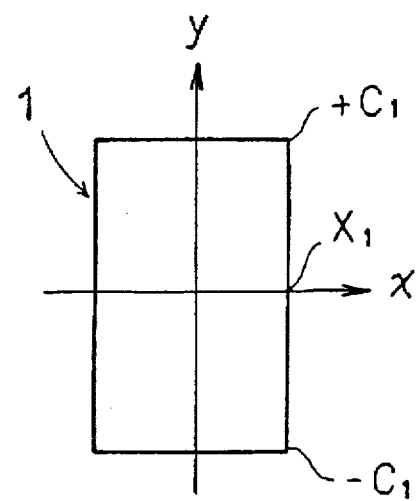
FIG. 4(b) is a diagram illustrating the coordinates used in the diagram of FIG. 4(a)
Figure 5:
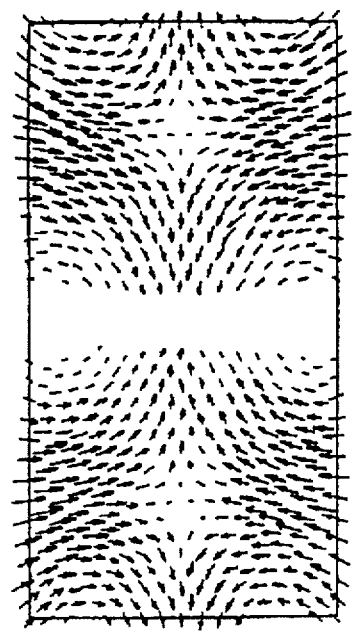
FIG. 5 is a diagram showing the distribution of displacement vectors in the displacement distribution shown in FIG. 4(a)

FIG. 4(a) shows the results of the analysis of the certain width mode made by a finite element method. FIG. 4(b) shows the positional relations in the piezoelectric resonator shown in FIG. 4(a). FIG. 5 is a diagram of displacement vectors showing the results of analysis of the excited certain width vibration mode of the piezoelectric resonator 1 where the analysis is made by the finite element method.

As can be seen from FIGS. 4(a), 4(b), and 5, the positional change (vibration or displacement) in the piezoelectric resonator 1 does not occur over the whole region which interconnects substantially central points C of the longer sides (i.e., in the vicinity of X axis shown in FIG. 4(b)). This means that the whole region interconnecting the substantially central points of the longer sides forms the node of the vibration in the case where the resonator is excited in the certain width mode. Therefore, the resonator can be successfully supported in the region interconnecting the substantially central points of the longer sides without degrading the resonant characteristics.

Figure 3:
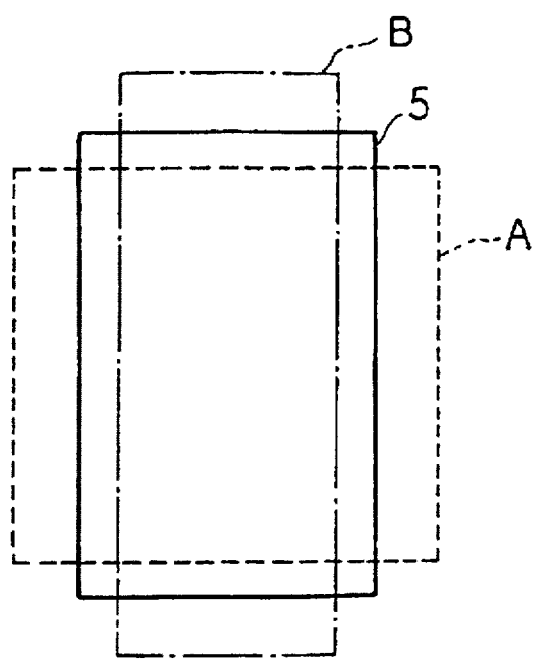
FIG. 3 is a schematic plan view, illustrating a width mode utilized in prior art devices.

On the other hand, in the well-known width vibration mode, as schematically shown in FIG. 3, a piezoelectric resonator 5 vibrates repeatedly between the state indicated by the broken line A and the state indicated by the dot-and-dash line B. Therefore, it is understood that the node of the vibration of the piezoelectric resonator 5 exists only at the center of the principal plane and that the whole portion of each longer side flaps or vibrates greatly.

Figure 6:
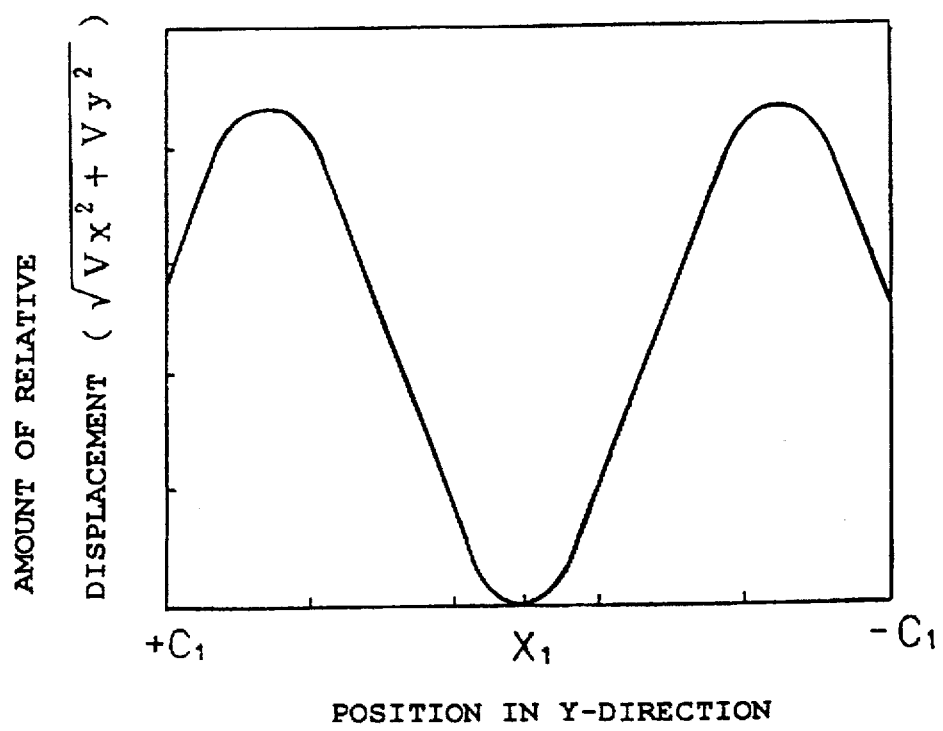
FIG. 6 is a diagram illustrating the relation of the amount of displacement to positions in the displacement distribution shown in FIG. 4(a), the positions being taken in the Y-direction.

FIG. 6 is a graph illustrating the relation of the amount of displacement given by $$\sqrt{v(V_x^2+V_y^2)}$$

to the displacement in the Y-direction where $x=X_1$ in the coordinate system shown in FIG. 4(b)(i.e., along one of the longer sides). In the above formula, $V_x$ and $V_y$ are amounts of displacement in the X and Y-directions, respectively.

It can be seem from FIG. 6 that in the piezoelectric resonator 1 excited under the certain width vibration mode, the amount of displacement is smallest in the center $X_1$ (FIG. 4(b)) of each longer side, and that the displacement is greatest at the midway point between the center $X_1$ and the end $+C_1$ or $-C_1$ of each longer side.

Accordingly, the piezoelectric resonator 1 of the present preferred embodiment can be supported without hindering the certain width mode, by supporting the resonator at the above-described node of vibration, i.e., the region interconnecting the substantially central points of the longer sides, with other support members.

The inventors have confirmed that if the ratio b/a is an integral multiple of $-2.70\sigma+2.86$, the certain width mode is excited in the same way as in the case where the region interconnecting the substantially central points of the longer sides forms a node as well as the case where the ratio b/a satisfies the relation $-2.70 \sigma+2.86$. This is further described by referring to FIGS. 17(a) and 17(b).

Figure 17A:
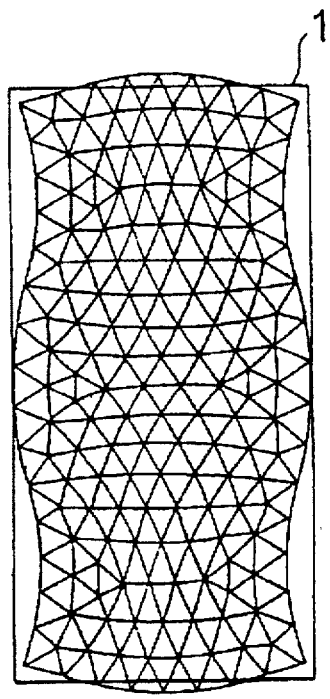
FIG. 17(a) is a diagram illustrating the displacement distribution in a resonating portion where n=2 in Eq. (1)

FIG. 17(a) is a diagram illustrating the results of an analysis of the displacement distribution in the piezoelectric resonator when the analysis is made by the finite element method under the condition n=2 in Eq. (1). It can be seen from this diagram that a certain width mode of vibration is excited similarly to that shown in FIGS. 4a, 4b and 5.

Figure 17B:
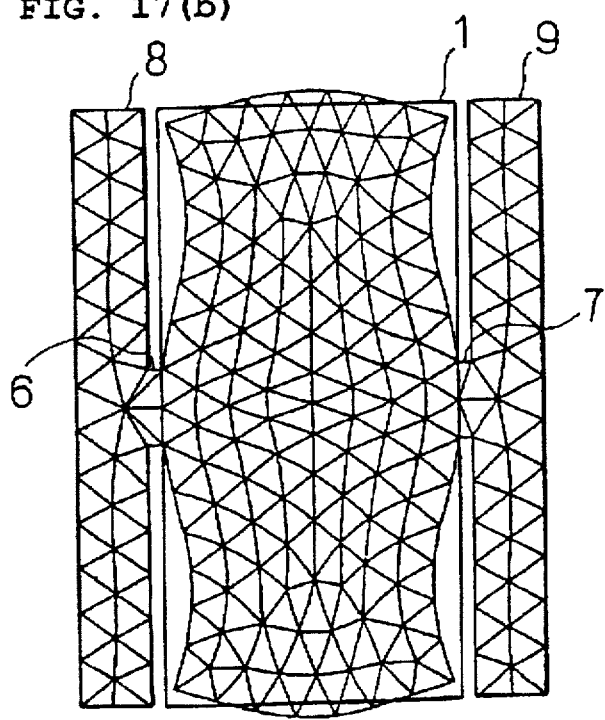
FIG. 17(b) is a diagram illustrating the displacement distribution in a resonator formed, using the resonating portion.

FIG. 17(b) illustrates the displacement distribution in the piezoelectric resonator 1 where n=2. Support members 6 and 7 are preferably coupled to the centers of the longer sides of the piezoelectric resonator 1 which are located opposite to each other. Holding portions 8 and 9 are located outside of the support members 6 and 7, respectively. It can be seen from FIG. 17(b) that the piezoelectric resonator 1 located between the support members 6 and 7 is excited in the certain width mode, and that the displacement is hardly transmitted to the support members 6 and 7.

The inventors have also discovered that the suitable ratio b/a depends on the Poisson ratio of the material of the piezoelectric resonator 1 in the case where the certain width vibration mode is excited.

Figure 7:
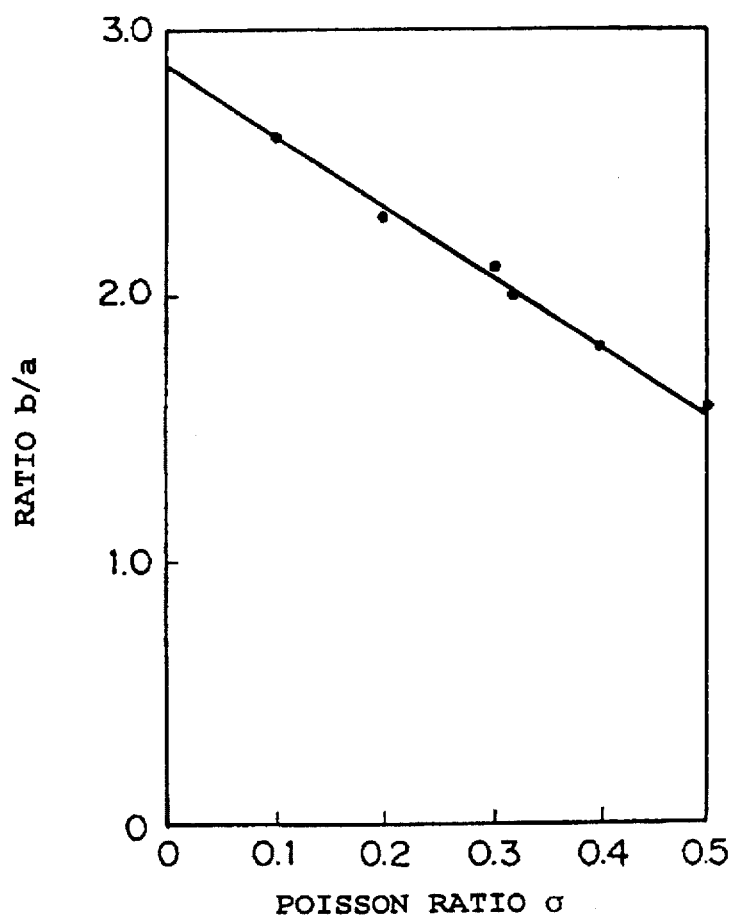
FIG. 7 is a graph showing the relation of the dimensional ratio b/a for exciting a transverse spreading mode to the Poisson ratio.

FIG. 7 shows the relation between the ratio b/a and the Poisson ratio $\sigma$ when the certain width mode is excited. As shown in FIG. 7, the ratio b/a is proportional to the Poisson ratio $\sigma$.

Consequently, the certain width mode can be excited with certainty by selecting the value of the ratio b/a so that the relation given by $$b/a=n(-2.70\sigma+2.86) \quad (1)$$

is satisfied, as indicated by the straight lines in FIG. 7(b). In the above equation, n is an integer greater than zero.

Figure 8:
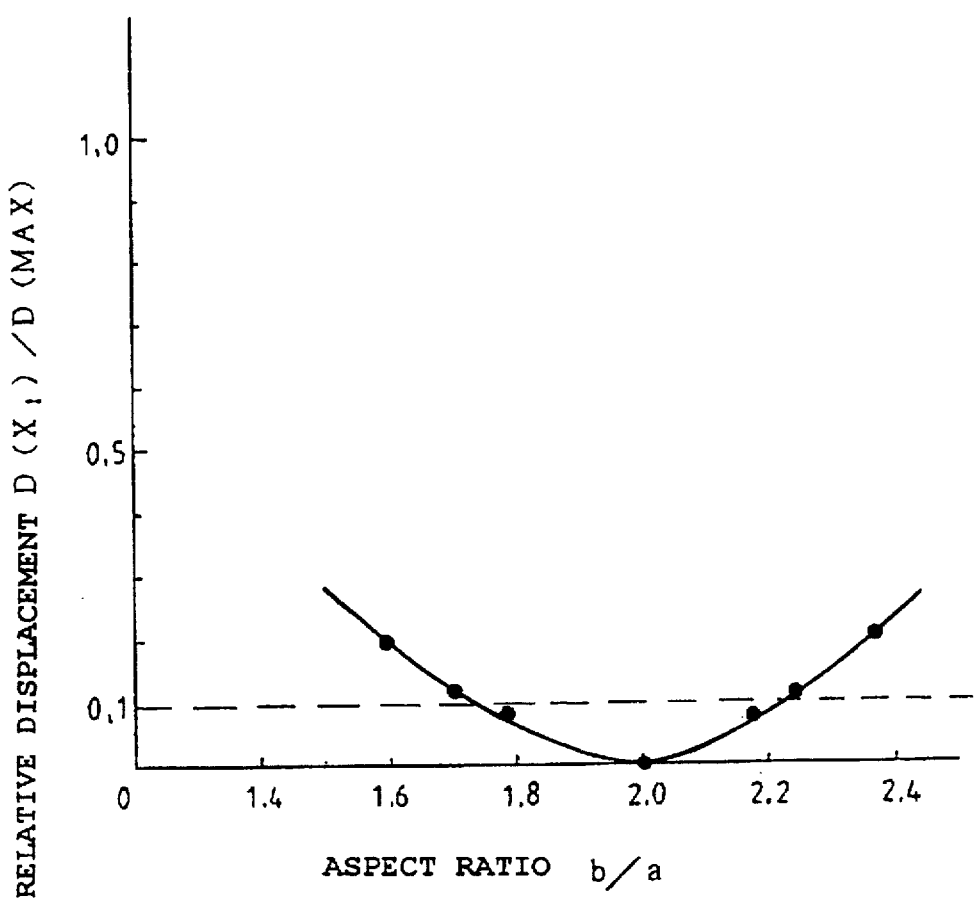
FIG. 8 is a graph showing the relation of the dimensional ratio b/a to the amount of relative displacement in the displacement distribution shown in FIG. 4(a)

Furthermore, the inventors have discovered that the width vibration mode is excited strongly even if the relation between the ratio b/a and the Poisson ratio $\sigma$ slightly deviates from Eq. (1). FIG. 8 shows a result obtained by varying the ratio b/a using a piezoelectric resonator 1 with a piezoelectric plate made from lead zirconate titanate whose Poisson ratio $\sigma=0.324$. In FIG. 8, the ordinate is plotted as the value $D(X_1)/D(MAX)$, where $D(X_1)$ is the amount of displacement at the point $X_1$ (FIG. 4(b)) and D(MAX) is the amount of displacement at the point at which the amount of displacement assumes the greatest value (FIG. 6) in the certain width mode.

As can be seen from FIG. 8, in the case where the Poisson ratio a=0.324, the relative displacement is within ±10% as long as the ratio b/a is within the range from about 1.787 to about 2.184. Plural samples of the piezoelectric resonator 1 are fabricated such that the ratio b/a is within ±10% of the optimum value of the ratio b/a. Support members are coupled to the centers of the longer side surfaces, and their resonant characteristics are measured. It is confirmed from the measurements that the certain width vibration mode is strongly excited in the case where the ratio b/a is set to be within ±10% of the value satisfying Eq. (1), i.e., the ratio b/a satisfies the following inequality:

$$0.9n(-2.70\sigma+2.86) \leq b/a \leq 1.1n(-2.70\sigma+2.86) \quad (2)$$

where n is integer.

Figure 9:
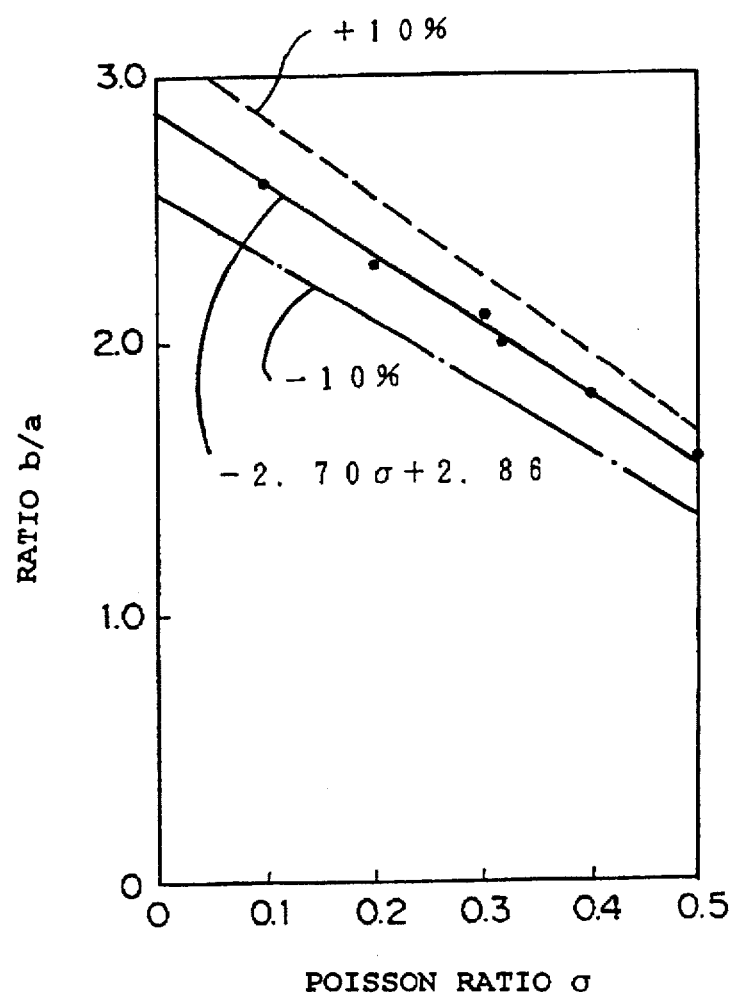
FIG. 9 is a graph showing the relation of the dimensional ratio b/a to the Poisson ratio.

Therefore, as shown in FIG. 9, if the ratio b/a is set ±10% of the value satisfying Eq. (1), the certain width mode can be definitely excited.

SECOND PREFERRED EMBODIMENT

Figure 10A:
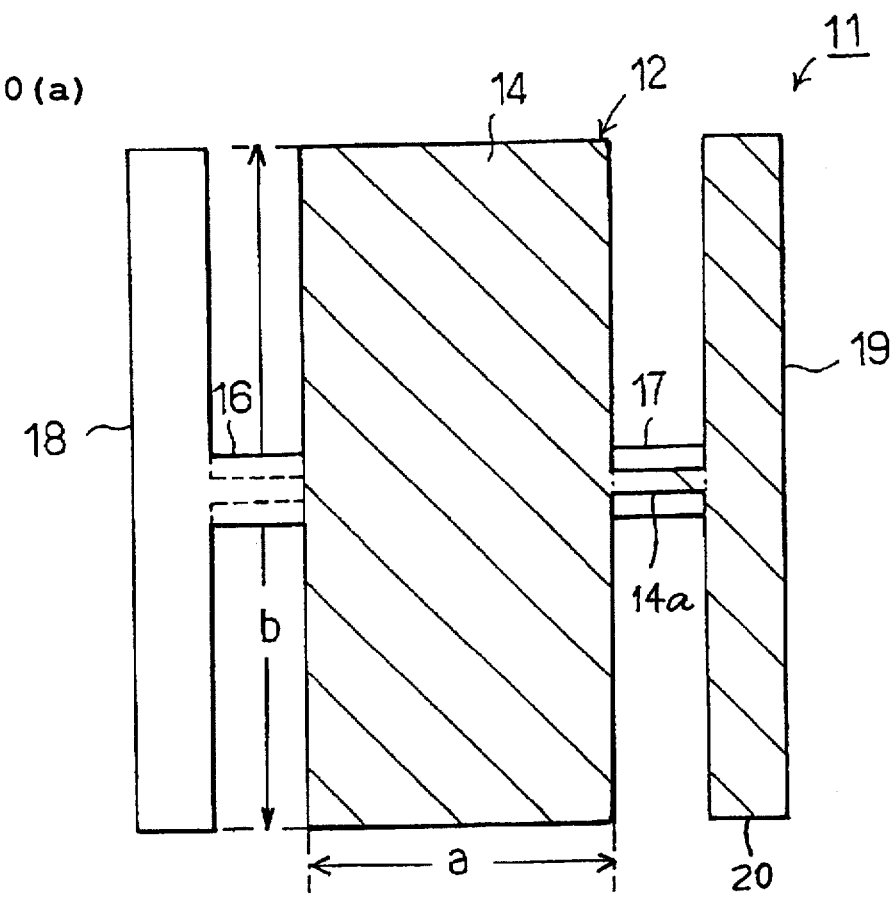
FIG. 10(a) is a plan view of a piezoelectric resonator according to a second preferred embodiment of the present invention, the resonator utilizing a certain width vibration mode.
Figure 10B:
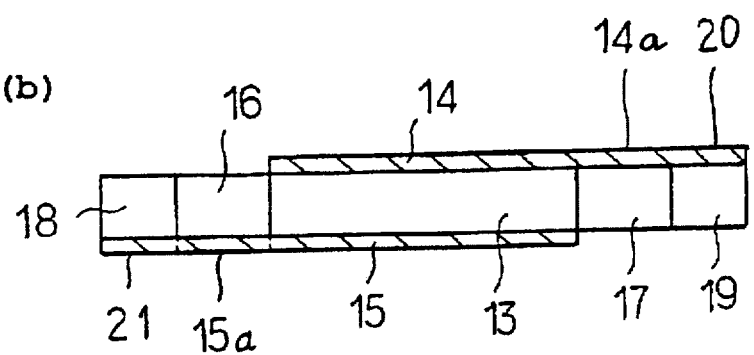
FIG. 10(b) is a front elevation of the piezoelectric resonator shown in FIG. 10(a)

FIG. 10(a) is a plan view of a piezoelectric resonator 11 utilizing the above-described certain width mode according to the second preferred embodiment of the present invention. FIG. 10(b) is a front elevation of the piezoelectric resonator 11. The piezoelectric resonator 11 has a piezoelectric resonating portion 12 in the form of a substantially rectangular plate. The resonating portion 12 acts as a vibrating body of substantially rectangular cross section parallel to the top and bottom surfaces thereof and includes a piezoelectric ceramic plate 13 and resonant electrodes 14 and 15. The piezoelectric ceramic plate 13 is preferably made of a piezoelectric ceramic material including lead zirconate titanate whose Poisson ratio is=0.324 and uniformly polarized in a thickness direction of the plate 13, i.e., in the direction perpendicular to the main plane thereof. The resonant electrodes 14 and 15 are preferably formed to extend along the entire area of the respective upper and lower surfaces of the piezoelectric ceramic plate 13. The ratio of the length b of the longer sides of the top surface of the ceramic plate 13 to the length a of the shorter sides is preferably set to be within ±10% of the value satisfying Eq. (1).

The piezoelectric resonator 11 includes support members 16 and 17. One end of each of the support members 16 and 17 is connected to the corresponding center of the respective one of the longer sides which is a part of the nodal region when the piezoelectric resonating portion 12 is excited under the certain width vibration mode.

Holding portions 18 and 19 each in the form of a substantially rectangular plate are coupled to the other ends of the support members 16 and 17, respectively. The holding portions 18 and 19 extend along the longitudinal direction of the piezoelectric resonating portion 12.

In the piezoelectric resonator 11, the support members 16, 17 and the holding portions 18, 19 are formed integrally with the piezoelectric ceramic plate 13. That is, a substantially piezoelectric ceramic plate is prepared and then machined into the form shown in FIG. 10(a).

However, the support members 16, 17 and the holding portions 18, 19 may be made from members that are separate from the piezoelectric ceramic plate 13. They may be bonded together as shown with adhesive or by other appropriate methods.

Extraction conductive portions 14a and 15a are preferably formed on respective surfaces of the support members 16 and 17. Terminal electrodes 20 and 21 are formed on respective surfaces of the holding portions 18 and 19. The resonant electrodes 14 and 15 are electrically connected with the terminal electrodes 20 and 21 via the extraction conductive portions 14a and 15a, respectively. As is apparent from FIG. 10a, the resonant electrode 14, the extraction conductive portion 14a, and the terminal electrode 20 and/or the resonant electrode 15, the extraction conductive portion 15a, and the terminal electrode 21 may be formed integrally from one electrode.

Figure 11:
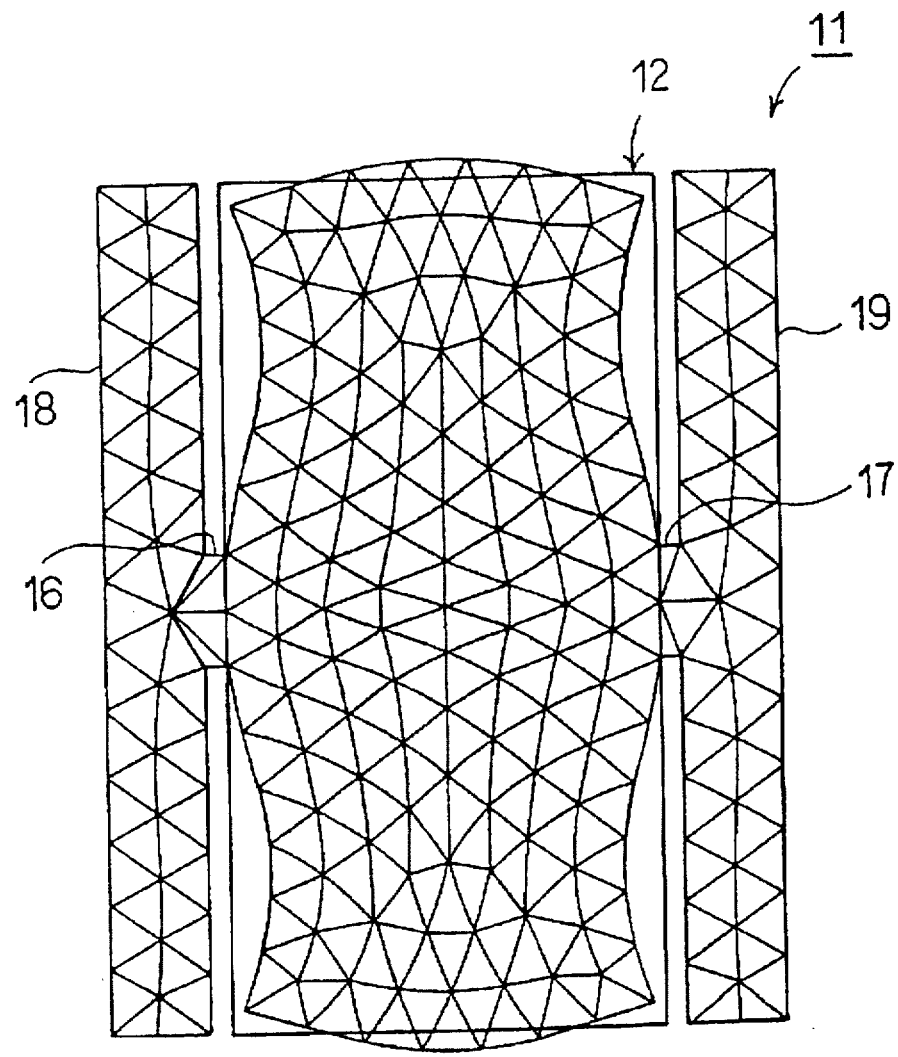
FIG. 11 is a diagram illustrating the displacement distribution on the piezoelectric resonator shown in FIGS. 10(a) and 10(b)

In the piezoelectric resonator 11, the piezoelectric resonating portion 12 is excited under the certain width vibration mode by applying an AC voltage across the terminal electrodes 20 and 21. As can be seen from the displacement distribution (FIG. 11) analyzed by the finite element method, the region interconnecting the centers of the longer sides of the piezoelectric resonating portion 12 is prevented from vibrating. Therefore, even if the above-described support members 16 and 17 are coupled to the centers of the longer sides, then the support members 16 and 17 do not affect the vibration of the resonating portion 12. As a result, the vibration under the certain width vibration mode can be effectively confined to an area between the support members 16 and 17. That is, the vibrational energy is confined within the vibrating resonance portion located between the support members 16 and 17. Hence, the piezoelectric resonator 11 can be used like an energy trap type piezoelectric resonator.

In the present preferred embodiment, the Poisson ratio is preferably set to be equal to 0.324. In one of the preferred embodiments where the piezoelectric ceramic plate 13 has a longer side b of 4.79 mm, a shorter side a of 2.41 mm, and a thickness of 0.30 mm, the resonant frequency is 800 kHz. In another of the preferred embodiments where the piezoelectric ceramic plate has a longer side b of 1.92 mm, a shorter side a of 0.96 mm, and a thickness of 0.20 mm, the resonant frequency is 2 MHz. It is therefore found that an energy trap type piezoelectric resonator adapted for use in the band from 800 kHz to 2 MHz can be constructed.

It is appreciated that the effective frequency band is varied if the piezoelectric resonating portion 12 is made of other material. Accordingly, energy trap type piezoelectric resonators 11 adapted for use in various frequency bands can be obtained by fabricating the resonating portion 12 out of various piezoelectric materials.

THIRD PREFERRED EMBODIMENT

Figure 12:
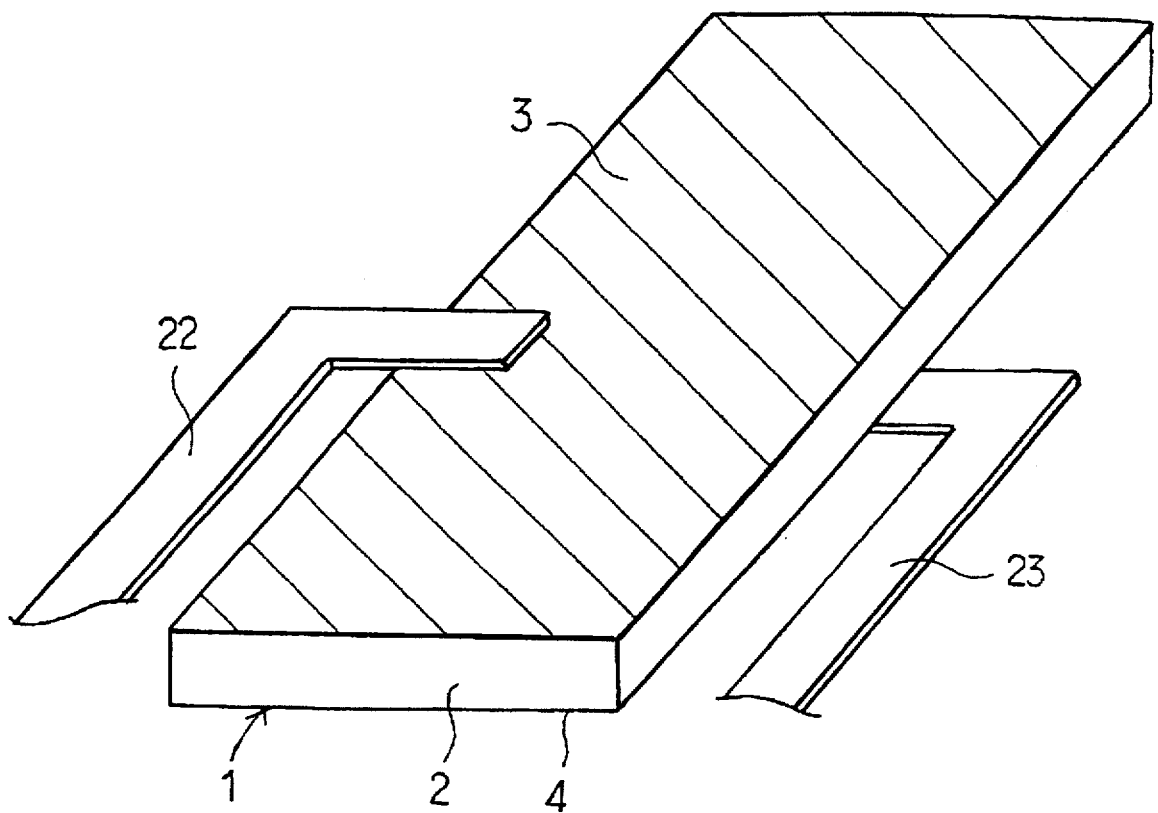
FIG. 12 is a perspective view of a piezoelectric resonator according to a third preferred embodiment of the invention, the resonator utilizing a certain width vibration mode.

FIG. 12 shows a piezoelectric resonator according to the third preferred embodiment of the present invention. The piezoelectric resonator shown in FIG. 12 is similar to the piezoelectric resonator described in connection with FIG. 1 except that metal terminals 22 and 23 acting as support members are soldered to the electrodes 3 and 4, respectively, which are located on the surfaces of the piezoelectric resonator 1 shown in FIG. 1. In this case, the ratio b/a is set so that the piezoelectric resonator 1 is excited strongly under the certain width vibration mode as described above. In the piezoelectric resonator 1, the region interconnecting the longer sides forms the node of vibration, and the metal terminals 22 and 23 are preferably soldered to the resonator 1. Therefore, in the piezoelectric resonator of the present preferred embodiment, the metal terminals 22 and 23 act as support members without degrading vibration under the certain width mode excited in the piezoelectric resonator 1. It is understood that each of the metal terminals 22 and 23 also acts as a terminal electrode through which an AC voltage is supplied to the resonant electrodes 3 and 4.

FOURTH PREFERRED EMBODIMENT

Figure 13:
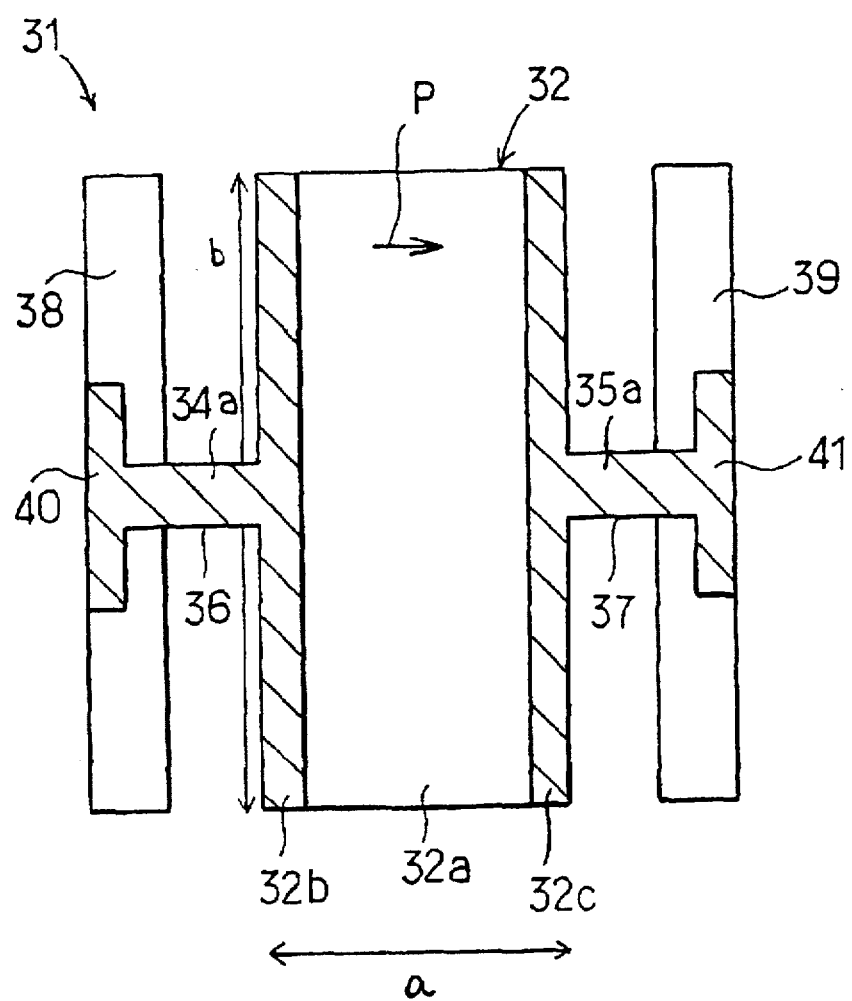
FIG. 13 is a perspective view of a piezoelectric resonator according to a fourth preferred embodiment of the invention, the resonator utilizing a certain width vibration mode.

FIG. 13 is a plan view of a piezoelectric resonator 31 according to the fourth preferred embodiment of the present invention. The piezoelectric resonator 31 has a piezoelectric resonating portion 32 acting as a vibrating body having a substantially rectangular cross section, in the same way as in the first preferred embodiment. However, the piezoelectric resonating portion 32 comprises a piezoelectric plate 32a, and a pair of resonant electrodes 32b and 32c disposed on the top surface of the piezoelectric plate 32a along the edges of the longer sides.

The piezoelectric plate 32a is polarized in the direction indicated by the arrow P, i.e., in a direction extending from the resonant electrode 32b toward the resonant electrode 32c. The polarized direction is parallel to the main surface of the piezoelectric plate 32a. The ratio of the length b of each of the longer sides of the piezoelectric resonating portion 32 to the length a of each of the shorter sides is preferably set to be within ±10% of the value satisfying Eq. (1).

The piezoelectric resonating portion 32 is caused to resonate in the certain width vibration mode by applying an AC voltage between the resonant electrodes 32b and 32c. In this case, the direction of displacement in the piezoelectric resonating portion 32 is parallel to the direction of the applied electric field. Consequently, a piezoelectric resonator utilizing a longitudinal piezoelectric effect is obtained.

That is, resonators making use of the inventive certain width mode are not limited to those utilizing a transverse piezoelectric mode. Resonators using a longitudinal piezoelectric effect may also be used.

In the piezoelectric resonator 31 of the present preferred embodiment, support members 36 and 37 are connected to the node of vibration of the piezoelectric resonating portion 32 resonating in the above-described certain width mode, i.e., connected to substantially central points of the longer sides. Holding portions 38 and 39 in the form of substantially rectangular plates are coupled to the outer ends of the support members 36 and 37, respectively. The holding portions 38 and 39 extend along the longitudinal direction of the piezoelectric resonating portion 32. As shown in FIG. 13, extraction conductive portions 34a and 35a are formed on the support members 36 and 37, and terminal electrodes 40, 41 are formed on the holding portions 38 and 39.

In the aforementioned first through fourth preferred embodiments of the present invention, the resonating portion preferably having a substantially rectangular cross section includes a piezoelectric body as a preferred embodiment. The subject matter of the preferred embodiments of the present invention is that the ratio b/a is preferably selected to be within a certain preferred range so that the resonating portion of substantially rectangular cross section is excited in the certain width vibration mode. Therefore, the resonating portion may be formed of a vibrating body other than a piezoelectric body.

FIFTH PREFERRED EMBODIMENT

Dynamic dampers can be formed on the outside of the support members connected with the resonating portion of the resonator, to cancel the vibration leaking from the resonating portion because of a dynamic damping phenomenon. A preferred embodiment of this type is shown as the fifth preferred embodiment of the invention in FIG. 14.

Figure 14:
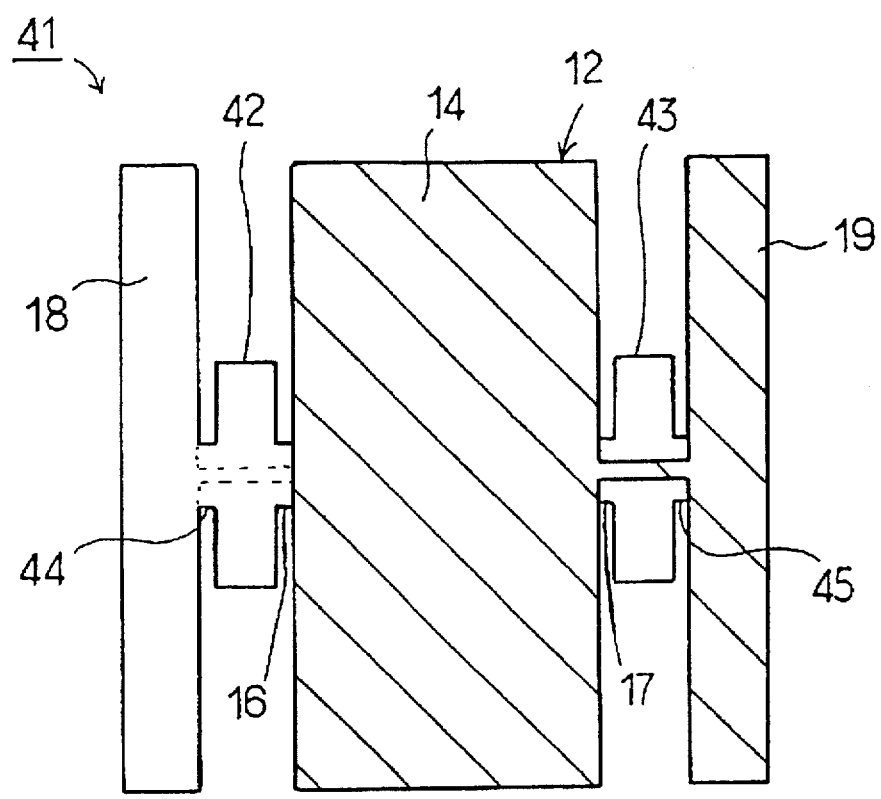
FIG. 14 is a plan view of a piezoelectric resonator according to a fifth preferred embodiment of the invention, the resonator utilizing a certain width vibration mode and having a dynamic vibration-absorbing portion.

In FIG. 14, a piezoelectric resonator 41 is a modification of the piezoelectric resonator 11 of the second preferred embodiment described previously in connection with FIGS. 10(a) and 10(b). It is to be noted that like components are denoted by like reference numerals and that components similar to their counterparts of FIGS. 10(a) and 10(b) will not be described below.

A pair of dynamic dampers 42 and 43 are preferably disposed at the outer side ends of the support members 16 and 17, respectively, of the piezoelectric resonator 41. Connector members 44 and 45 are connected to the centers of the outer side surfaces of the dynamic dampers 42 and 43, respectively. The outer ends of the connector members 44 and 45 are connected to the holding portions 18 and 19, respectively. That is, this piezoelectric resonator 41 is similar to the piezoelectric resonator 11 shown in FIGS. 10(a) and 10(b) except that the dynamic dampers 42 and 43 and the connector members 44 and 45 are added.

The dynamic dampers 42 and 43 are provided to cancel vibration leaking from the resonator 41 because of a well-known dynamic damping phenomenon. Specifically, the dynamic dampers 42 and 43 receive vibration leaking from the resonator 41 and absorb the leaking vibration by vibrating at a frequency that is substantially equal to a frequency of the leaking vibration. As a result, the vibration leaking from the resonating portion 12 is canceled.

SIXTH PREFERRED EMBODIMENT

Figure 15:
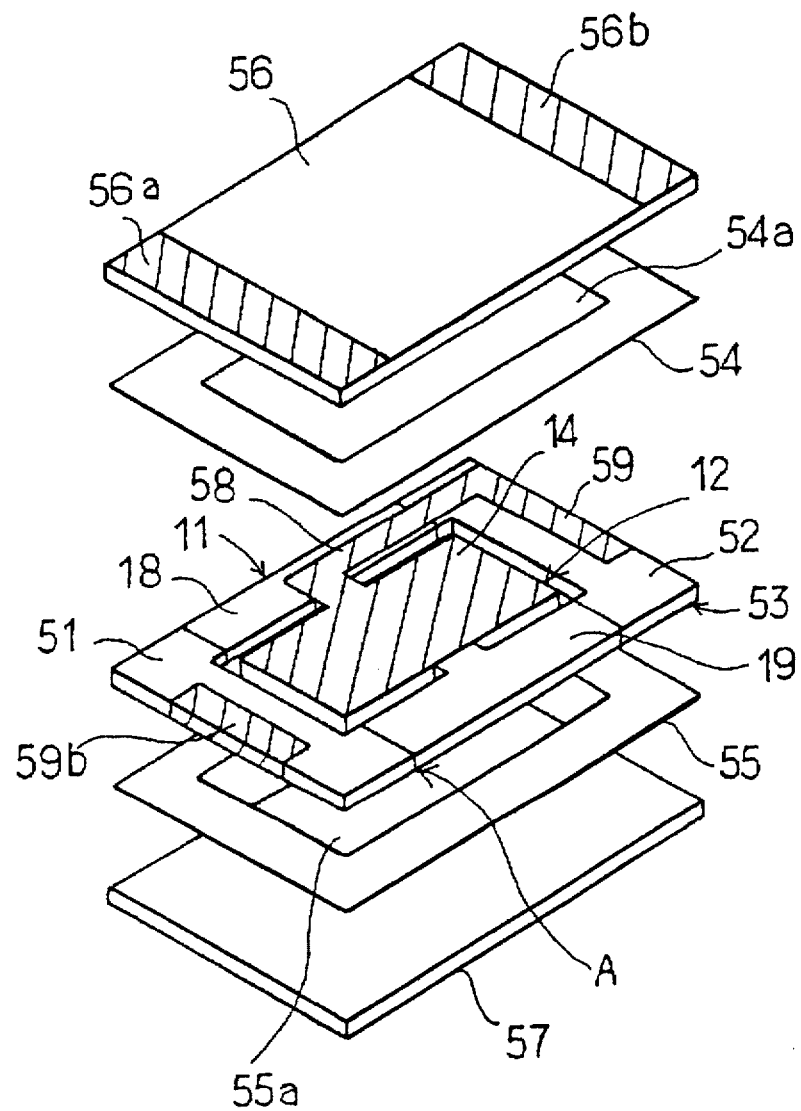
FIG. 15 is an exploded perspective view of a chip-type resonant component according to a sixth preferred embodiment of the invention.
Figure 16:
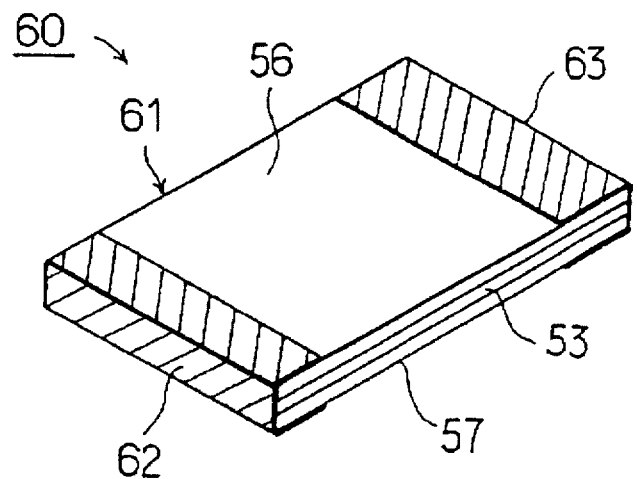
FIG. 16 is a perspective view of a chip-type resonant component.

FIG. 15 is a perspective view of an exploded perspective view showing a chip-type piezoelectric resonant component according to the sixth preferred embodiment of the present invention. FIG. 16 is a perspective view of the resonant component.

The chip-type piezoelectric resonant component is constructed by using a piezoelectric resonator similar to the piezoelectric resonator 11 utilizing the certain width vibration mode described above.

More specifically, spacer plates 51 and 52 each having a thickness almost equal to that of the piezoelectric resonator 11 are bonded to the side surfaces of the piezoelectric resonator 11, thus forming a resonant plate 53. An extraction conductive portion 58 extending from the resonant electrode 14 is formed on the holding portion 18 and is electrically connected with a terminal electrode 59 formed on the top surface of the spacer plate 52. This terminal electrode 59 extends out to the outer end of the resonant plate 53, i.e., the outer end of the spacer plate 52. A terminal electrode 59b extending to the outer end is formed on the top surface of the spacer plate 51. This terminal electrode 59b is formed so as to extend to the bottom surface of the spacer plate 51 across one side surface. On the bottom side of the spacer plate 51, the terminal electrode 59b is electrically connected with a resonant electrode (not shown) formed on the bottom surface of the piezoelectric resonator 11. The terminal electrode 59b is also electrically connected with an extraction conductive portion (not shown) and a resonant electrode (not shown).

Each of the spacer plates 51 and 52 preferably has a substantially U-shaped planar form. The spacer plates 51 and 52 are joined to the holding portions 18 and 19, respectively, of the piezoelectric resonator 11 at both ends thereof, thus forming an integrated structure.

The spacer plates 51 and 52 can be made of any arbitrary insulating material. Examples of the material include insulating ceramics such as alumina and synthetic resins. The spacer plates 51 and 52 are bonded to the holding portions 18 and 19, respectively, of the piezoelectric resonator 11, using an appropriate cementing material such as an adhesive.

Substantially rectangular frame-like space-forming members 54 and 55 acting as space-forming means are positioned respectively above and below the resonant plate 53. Case bases 56 and 57 are bonded to the top and the bottom, respectively, of the resonant plate 53 via the space-forming members 54 and 55 with an insulating adhesive.

The space-forming members 54 and 55 are positioned so as not to prevent the vibration of the vibrating portion of the piezoelectric resonator 11, i.e., the piezoelectric resonating portion 12. To achieve this goal, the size of openings 54a and 55a in the space-forming members 54 and 55 and the thickness of the space-forming members 54 and 55 are determined.

The space-forming members 54 and 55 can be made of insulating resinous film such as polyethylene terephthalate film and adhesive in the form of a sheet. The members 54 and 55 may also be made of other arbitrary insulating material.

The case bases 56 and 57 can be fabricated from insulating ceramics such as alumina and appropriate synthetic materials such as synthetic resins. The resonant plate 53 is held between the case bases 56 and 57 via the space-forming members 54 and 55, thus forming an integrated structure. In this way, a chip-type piezoelectric resonant component 60 shown in FIG. 16 is constructed.

In the chip-type piezoelectric resonant component 60, the case bases 56 and 57 are bonded together to form an integrated lamination 61. Outer electrodes 62 and 63 are formed at both end surfaces of the lamination 61. The outer electrodes 62 and 63 can be formed out of a conductive material by plating, evaporation, sputtering, or other suitable technique. Alternatively, a conductive paste is applied and cured.

When the chip-type piezoelectric resonant component 60 is installed on a printed-circuit board or the like, the outer electrodes 62 and 63 are disposed preferably not only at both end surfaces of the lamination but also on the top and bottom surfaces as shown to facilitate making electrical connection with the conductive pattern on the printed-circuit board. In order to make it easy to form the outer electrodes 62 and 63 on the top and bottom surfaces of the lamination, electrodes 56a and 56b have been previously formed on the top surface of the case base 56 as shown in FIG. 15. A pair of similar electrodes (not shown) are formed on the bottom surface of the case base 57.

The electrodes 56a and 56b are not always required to have been previously formed. After obtaining the lamination 61, the material of the outer electrodes may be applied or provided so as to extend to the top and bottom surfaces.

In the present preferred embodiment, separate members are preferably prepared as the space-forming members 54 and 55. However, a recess having a space corresponding to an opening 54a of the space forming member 54 may be formed in the bottom surface of the case base 56. Similarly, a recess having a space corresponding to an opening 55a may be formed in the top surface of the case base 57. In this way, spaces are secured to prevent the vibration of the vibrating portion of the piezoelectric resonator 11 from being hindered. In this case, the use of the space-forming members 54 and 55 can be omitted by adjusting the depth of the recesses.

Further, an insulating adhesive may be applied to substantially rectangular frame-like regions in the bottom surface of the case base 56 and in the top surface of the case base 57 instead of using the space-forming members and the above-described recesses. The thickness of the adhesive is adjusted to form spaces for preventing the vibration of the resonating portion 12 of the piezoelectric resonator 11 from being hindered. In this case, the insulating adhesive for bonding the case bases 56 and 57 to the resonant plate 53 acts also as the space-forming means of the preferred embodiments of the present invention.

In the resonant components shown in FIGS. 15 and 16, the piezoelectric resonator 11 shown in FIGS. 10(a) and 10(b) is used. Other preferred embodiments of the present invention, such as the preferred embodiment of the piezoelectric resonator 31 shown in FIG. 13, may also be used, in which case a chip-type resonant component can be readily fabricated in a similar manner to that described above.

SEVENTH PREFERRED EMBODIMENT

In the chip-type piezoelectric resonant component 60 shown in FIG. 16, the piezoelectric resonator 11 is bonded to the spacer plates 51 and 52 via the insulating adhesive, as shown in FIG. 15. Therefore, if poor adhesion occurs at the junction indicated by the arrow A in FIG. 15, then the sealing properties are destroyed. This means that the resonant portion 12 of the piezoelectric resonator 11 is imperfectly sealed, which results in the characteristics of the chip-type piezoelectric resonant component such as moisture resistance being deteriorated.

Figure 18:
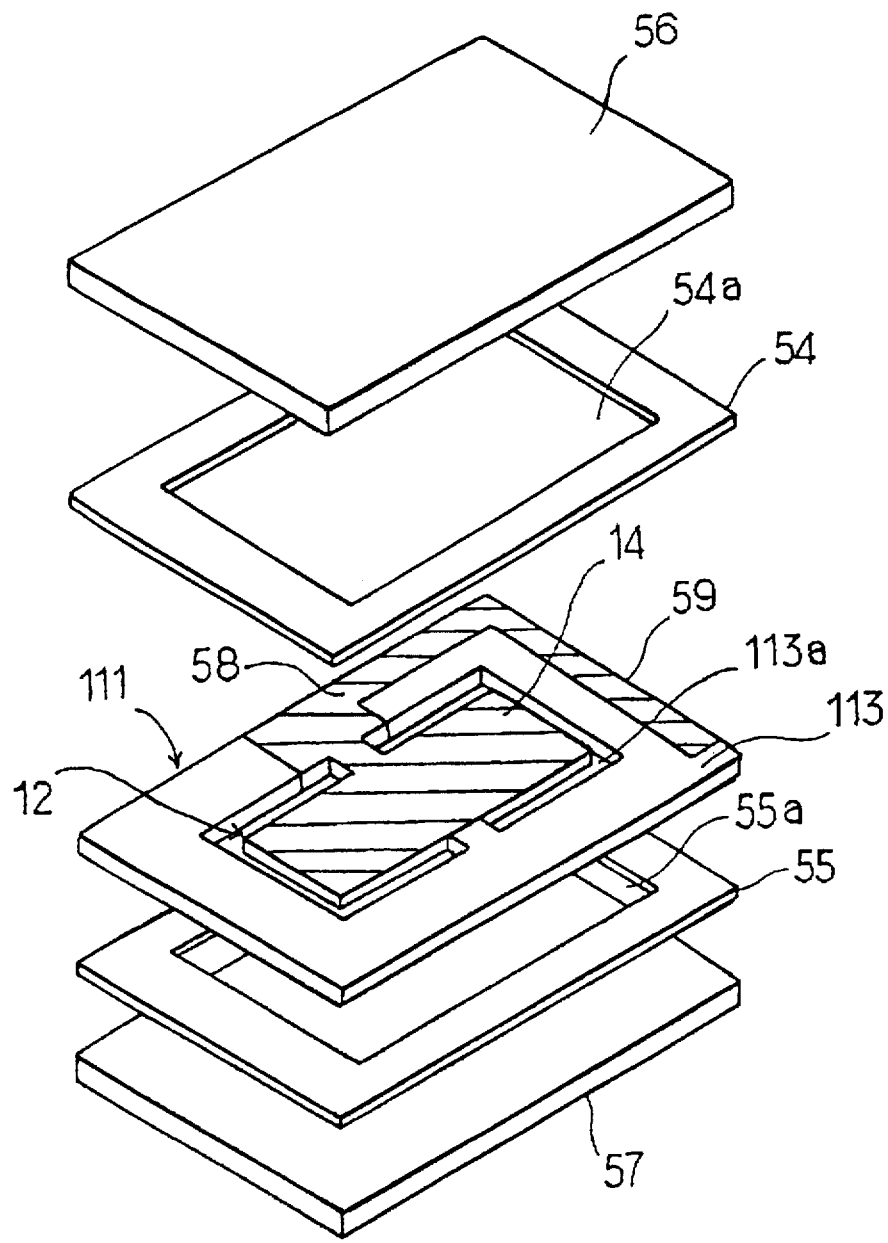
FIG. 18 is an exploded perspective view of a chip-type piezoelectric resonating component according to a seventh preferred embodiment of the invention.

The seventh preferred embodiment of the present invention which can overcome the above-described problem of moisture resistance is now described by referring to FIGS. 18-21. FIG. 18 is an exploded perspective view of a chip-type piezoelectric resonant component according to the seventh preferred embodiment. In the chip-type piezoelectric resonant component shown in FIG. 18, a piezoelectric resonator 111 including a plate having a substantially rectangular contour is used instead of the piezoelectric resonator 11 and the spacer plates 51, 52 shown in FIG. 15. Other structures, i.e., the space-forming members 54, 55 and the protective bases 56, 57, are similar to their counterparts of the preferred embodiment shown in FIG. 15. Like components are indicated by like reference numerals and those components which have been described in connection with FIG. 15 will not be described below.

Figure 19:
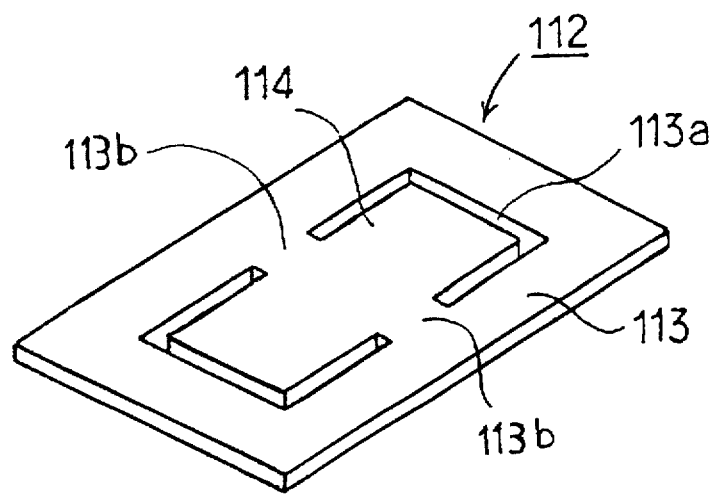
FIG. 19 is a perspective view of a piezoelectric ceramic plate used in the piezoelectric resonator shown in FIG. 18.

The piezoelectric resonator 111 is preferably made of a piezoelectric ceramic plate 112 shown in the perspective view of FIG. 19. Specifically, one substantially rectangular piezoelectric ceramic plate is shaped into the form shown in FIG. 19 by laser-etching or machining or other suitable method. More specifically, the ceramic plate 112 includes a substantially rectangular frame-like support portion 113 and a piezoelectric ceramic plate portion 114 forming a resonating portion. Two openings 113a having a substantially U-shape are provided between the support portion 113 and the piezoelectric ceramic plate portion 114 so that remaining portions 113b are connected between the support portion 113 and the piezoelectric ceramic plate portion 114. It is appreciated that the remaining portions 113b are located at center portions of longer sides, respectively, of the piezoelectric ceramic plate portion 114.

Figure 20:
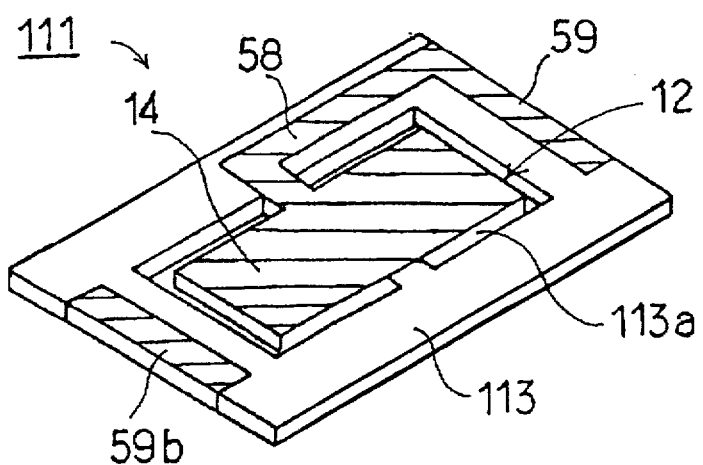
FIG. 20 is a perspective view of a piezoelectric resonator.

Electrodes are preferably formed on the ceramic plate 112 in the same way as in the case of the piezoelectric resonator 11. Consequently, the piezoelectric resonator 111 shown in FIG. 20 is derived. Alternatively, a base on which electrodes have been previously formed may be machined into the piezoelectric resonator 111 shown in FIG. 20.

The piezoelectric resonator 111 is similar to the piezoelectric resonator 11 shown in FIG. 15 having the spacer plates 51, 52 integrally formed with the resonator 11. Therefore, the resonating portion, the electrodes, and other parts of the piezoelectric resonator 111 are indicated by the same reference numerals as used to indicate their counterparts of the piezoelectric resonator 11, and will not be described below.

As is explained hereinbefore, the piezoelectric resonator 111 shown in FIG. 18 is constructed, using the single piezoelectric ceramic plate 112. Therefore, there is no junction on the sides of the resonator portion of the chip-type piezoelectric resonant component. Accordingly, the moisture resistance is enhanced effectively.

Figure 21:
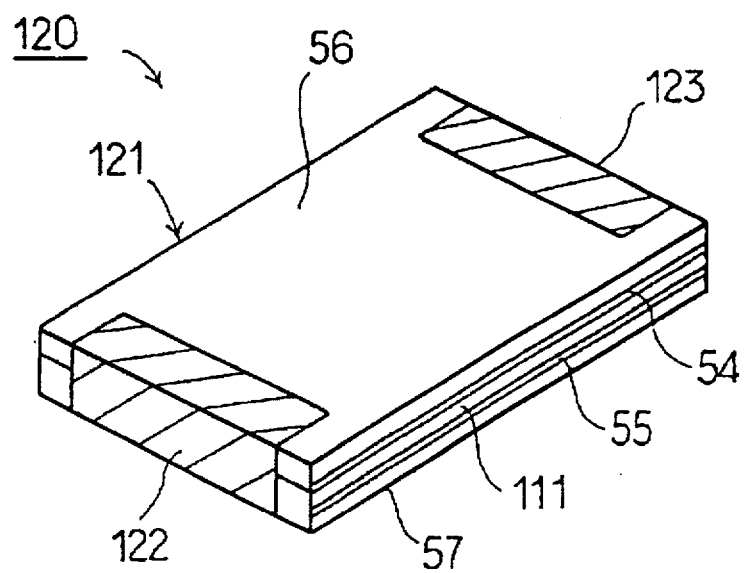
FIG. 21 is a perspective view of the chip-type piezoelectric resonating component shown in FIG. 18.

FIG. 21 is a perspective view of a chip-type piezoelectric resonant component, indicated by numeral 120, obtained by stacking the piezoelectric resonator 111, the space-forming members 54, 55, and the protective bases 56, 57 shown in FIG. 18. These members are bonded together to form a lamination 121. Outer electrodes 122 and 123 are arranged so as to cover a pair of end surfaces of the lamination 121. Therefore, this chip-type piezoelectric resonant component can be installed on a plane such as a printed-wiring board, in the same way as other chip-type electronic parts.

Figure 22:
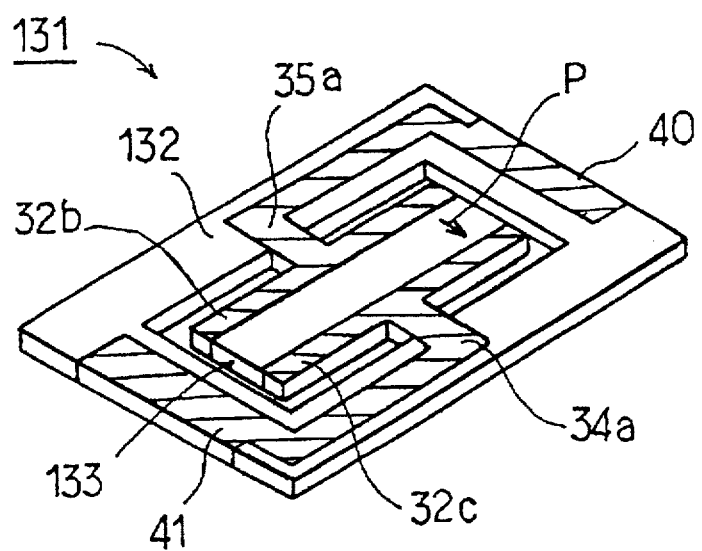
FIG. 22 is a perspective view of a modified preferred embodiment of an integrated piezoelectric resonator having a substantially rectangular frame-like support member.

FIG. 22 shows a modification of the aforementioned piezoelectric resonator 111. This piezoelectric resonator, generally indicated by reference numeral 131, includes a substantially rectangular frame-like support member 132 and a piezoelectric resonator portion 133 which is integral with the support member 132. The piezoelectric resonator portion 133 is constructed similarly to the piezoelectric resonator 31 shown in FIG. 13. The structures of the resonating portion and other parts are the same as their counterparts of the piezoelectric resonator 31 and indicated by the same reference numerals as used to indicate their counterparts. Therefore, these parts will not be described below.

Also in the piezoelectric resonator 131, the substantially rectangular frame-like support portion 132 is integral with the piezoelectric resonating portion 133. Where a chip-type piezoelectric resonant component is built, its moisture resistance can be effectively enhanced, in the same way as the piezoelectric resonator 111 shown in FIGS. 18 and 20.

EIGHTH PREFERRED EMBODIMENT

In the above-described preferred embodiments, each piezoelectric resonator is preferably provided with one resonating portion utilizing the certain width vibration mode. The preferred embodiments of the present invention can also be applied to a piezoelectric filter having a plurality of resonating portions utilizing the certain width vibration mode. A preferred embodiment of this type is described as the eighth preferred embodiment of the invention by referring to FIGS. 23(a) and 23(b).

Figure 23A:
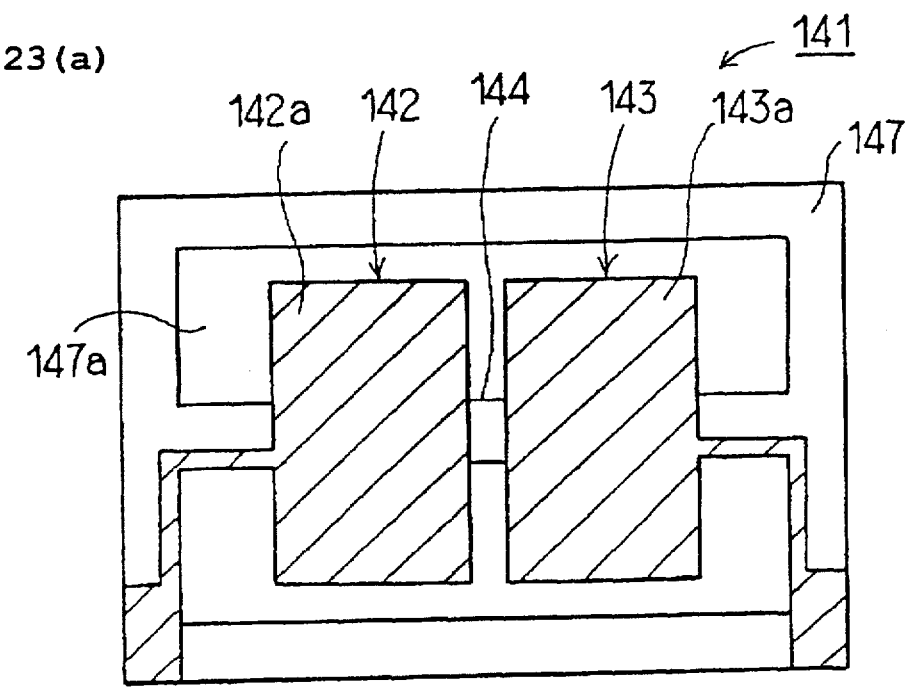
FIG. 23(a) is a plan view of a piezoelectric filter which is a piezoelectric resonator according to an eighth preferred embodiment of the invention.
Figure 23B:
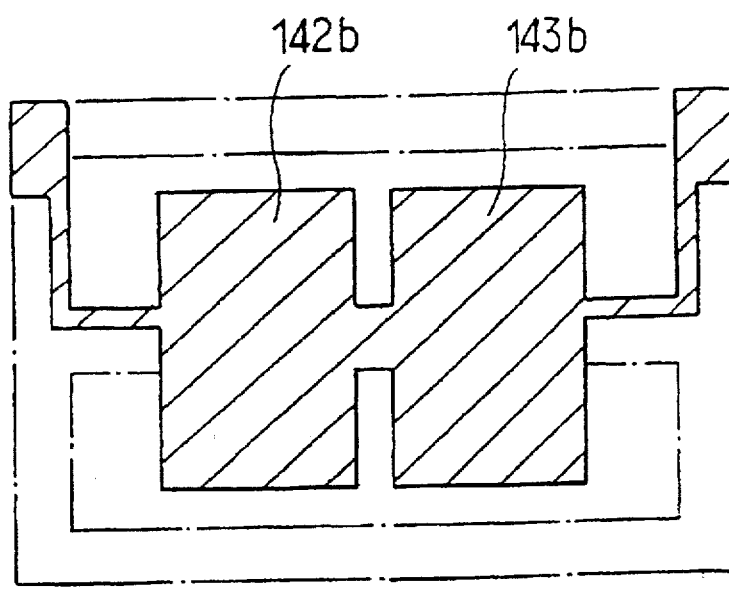
FIG. 23(b) is a schematic plan view of an electrode structure located under a piezoelectric ceramic plate, the electrode structure being included in the piezoelectric resonator shown in FIG. 23(a)

FIG. 23(a) is a plan view of the piezoelectric filter. FIG. 23(b) is a schematic plan view of an electrode structure located under a piezoelectric ceramic plate, the electrode structure being included in the piezoelectric filter.

The piezoelectric resonator 141 is used to form a double-mode piezoelectric filter. The piezoelectric resonator 141 has a first piezoelectric resonating portion 142 and a second piezoelectric resonating portion 143 both of which make use of the certain width vibration mode. The piezoelectric resonating portion 142 includes a substantially rectangular piezoelectric ceramic plate which is polarized uniformly in the direction of thickness and electrodes 142a and 142b which are disposed on upper and lower major surfaces of the substantially rectangular piezoelectric ceramic plate. The piezoelectric resonating portion 143 includes a substantially rectangular piezoelectric ceramic plate which is polarized uniformly in a thickness direction and electrodes 143a and 143b which are disposed on upper and lower major surfaces of the substantially rectangular piezoelectric ceramic plate.

The first and second piezoelectric resonating portions 142 and 143, respectively, are excited in the certain width vibration mode. The nodes of the vibration are interconnected by a connector member 144. The electrodes 142b and 143b are electrically connected with each other by a connector conductive portion formed on the underside of the connector member 144, thus forming a common resonating electrode. The electrode 142a or 143a is used as an input or output electrode. The electrodes 142b and 143b on the underside are used as grounding electrodes. Thus, a double-mode piezoelectric filter making use of a symmetrical mode and an asymmetrical mode is formed.

The piezoelectric resonator 141 is characterized in that the two piezoelectric resonating portions 142 and 143 are employed. Each of the piezoelectric resonating portions 142 and 143 is similar to the piezoelectric resonator 11 in other respects. Substantially central portions of the outer longer side surfaces of the first and second piezoelectric resonating portions 142 and 143, respectively, are coupled to a substantially rectangular frame-like support portion 147 via support members. Therefore, the first and second piezoelectric resonating portions 142 and 143, respectively, are positioned in an opening 147a formed in the support portion 147.

These piezoelectric resonating portions 142 and 143 disposed in the opening 147a are formed integrally with the support portion 147. An integrated member having the illustrated planar shape can be obtained by machining or laser-etching a piezoelectric ceramic plate.

NINTH PREFERRED EMBODIMENT

Figure 24:
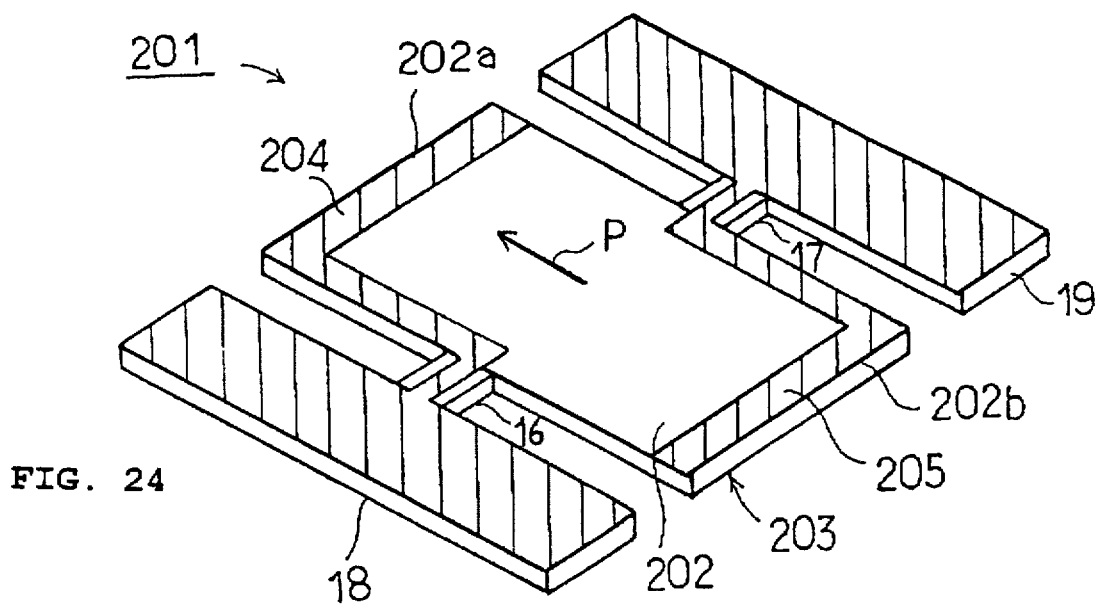
FIG. 24 is a perspective view of a piezoelectric resonator according to a ninth preferred embodiment of the invention.

FIG. 24 is a perspective view of a piezoelectric resonator according to the ninth preferred embodiment of the invention. The piezoelectric resonator 201 makes use of a transverse piezoelectric effect, in the same way as the piezoelectric resonator 11 shown in FIGS. 10(a) and 10(b). The piezoelectric resonator 201 has a piezoelectric resonating portion 203 including a piezoelectric ceramic plate 202 having a substantially rectangular cross section. The piezoelectric resonating portion 203 is made different in structure from the piezoelectric resonator 11. Specifically, the piezoelectric ceramic plate 202 is polarized in the direction indicated by the arrow P (FIG. 24) parallel to the main plane. Resonant electrodes 204 and 205 are formed on the top surface of the ceramic plate 202 along the edges 202a and 202b of the shorter side surfaces. The piezoelectric resonator 201 is similar to the piezoelectric resonator 11 in other respects, and these similar points will not described below.

Since the direction interconnecting the resonant electrodes 204 and 205, i.e., the direction in which the voltage is applied, is perpendicular to displacement, a resonator utilizing a transverse piezoelectric effect by applying an AC voltage between the resonant electrodes 204 and 205 is provided. In the present preferred embodiment, the ratio b/a of the length of each of the longer sides of the piezoelectric ceramic plate 202 to the length of each of the shorter sides is selected to have the same relation as used in the preferred embodiment already described in connection with FIGS. 10(a) and 10(b). Thus, a piezoelectric resonator utilizing the certain width mode is provided, in the same way as the preferred embodiment already described in connection with FIGS. 10(a) and 10(b). Consequently, the resonator can be mechanically held with holding portions 206 and 207.

TENTH PREFERRED EMBODIMENT

Figure 25:
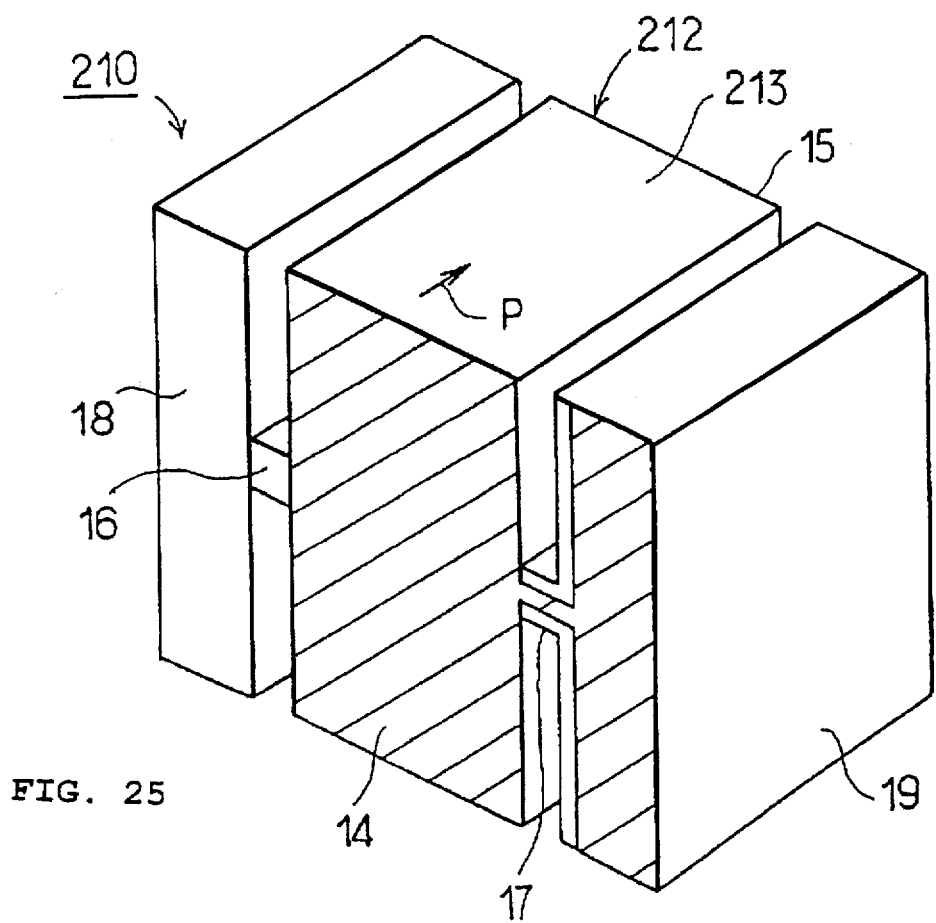
FIG. 25 is a perspective view of a piezoelectric resonator according to a tenth preferred embodiment of the invention.

FIG. 25 is a perspective view of a piezoelectric resonator according to the tenth preferred embodiment of the invention. The piezoelectric resonator 210 is a modification of the piezoelectric resonator 11 shown in FIGS. 10(a) and 10(b). In the piezoelectric resonator 11 shown in FIGS. 10(a) and 10(b), the piezoelectric ceramic plate 13 is used. On the other hand, in the piezoelectric resonator 210, a piezoelectric ceramic box-like member 213 which is considerably thicker than the piezoelectric ceramic plate 13 is used. That is, the piezoelectric ceramic member 213 forming the piezoelectric resonating portion 212 has a substantially rectangular cross-sectional shape whose ratio b/a is selected in the same manner as in the preferred embodiment described in conjunction with FIGS. 10(a) and 10(b). Resonant electrodes 14 (only one is shown) are located on the surfaces which are parallel to the substantially rectangular cross section. In this way, in the present invention, the vibrating body of substantially rectangular cross section may have a box-like shape having a thickness larger than the length b of each of the longer sides of the substantially rectangular shape.

ELEVENTH PREFERRED EMBODIMENT

Figure 26:
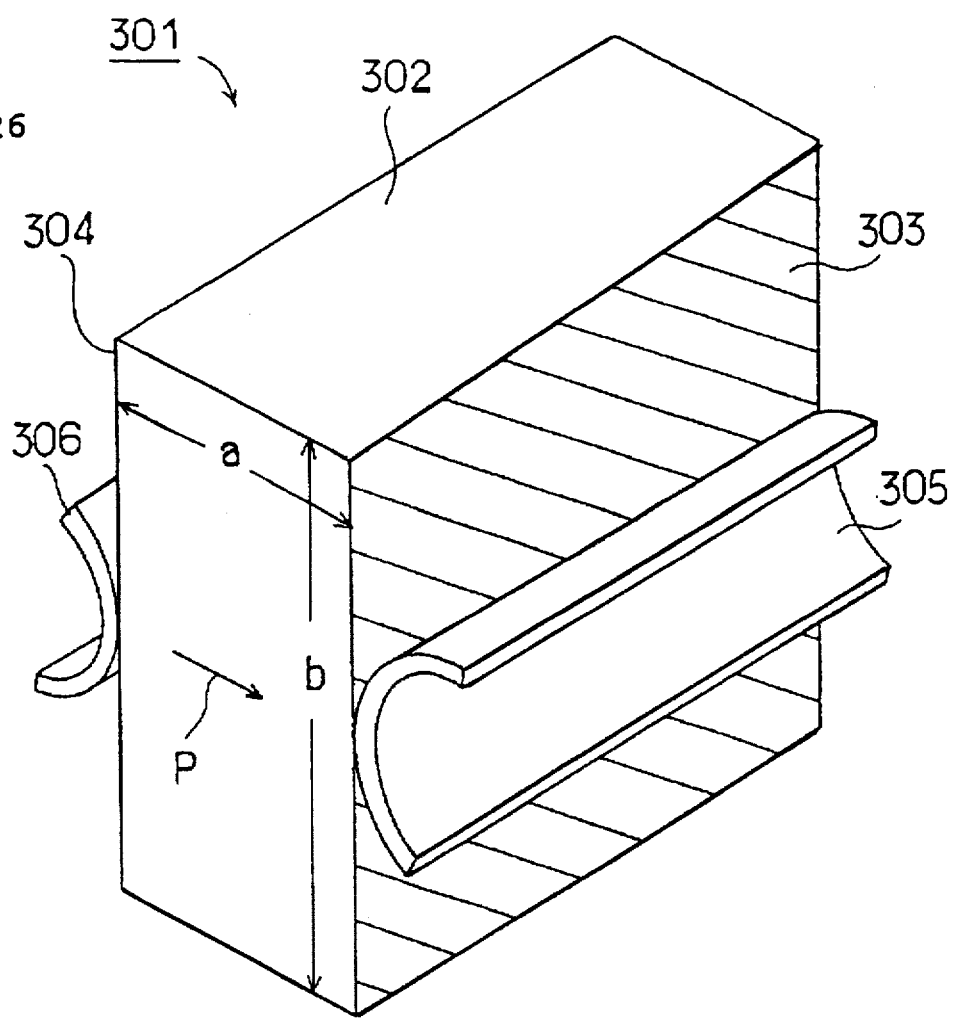
FIG. 26 is a perspective view of a piezoelectric resonator according to an eleventh preferred embodiment of the invention, and in which the piezoelectric resonator is held by spring terminals.

FIG. 26 is a perspective view of a piezoelectric resonator according to the eleventh preferred embodiment of the invention. A piezoelectric resonator 301 includes a substantially box-like piezoelectric ceramic member 302 including longer sides each having a length b and shorter sides each having a length a. This piezoelectric ceramic member 302 having a substantially rectangular cross section is polarized in the direction indicated by the arrow P, i.e., in a direction parallel to the shorter sides. Resonant electrodes 303 and 304 are formed on a pair of opposite side surfaces of the piezoelectric ceramic member 302. These opposite side surfaces are located on the sides of the aforementioned longer side surfaces. The piezoelectric resonator 301 further includes a pair of spring terminals 305 and 306 for supporting the piezoelectric ceramic member 302.

The piezoelectric resonator 301 is excited in the certain width expansion vibration mode by applying an AC voltage between the resonant electrodes 303 and 304. The node of the vibration is located in the entire region interconnecting the longer side surfaces. More specifically, the node of the vibration appears over the whole region extending circumferentially of piezoelectric ceramic member 302 at the center of the longer side having the length b. Thus, as shown in FIG. 26, the resonator can be easily mechanically held with spring terminals 305 and 306 at the aforementioned node.

As described above, the piezoelectric resonator 301 shown in FIG. 26 can be held with the spring terminals 305 and 306. In this case, the node of the vibration extends along the lines which interconnect the center points of 4 longer sides having the length b. In other words, the node of the vibration extends circumferentially at a height which is substantially equal to half of the height of the piezoelectric ceramic member 302. Hence, the concentration of stress between the resonator 301 and each of the spring terminals 305 and 306 is not very great. Consequently, the possibility that the resonator 301 cracks is very small.

TWELFTH PREFERRED EMBODIMENT

Figure 27:
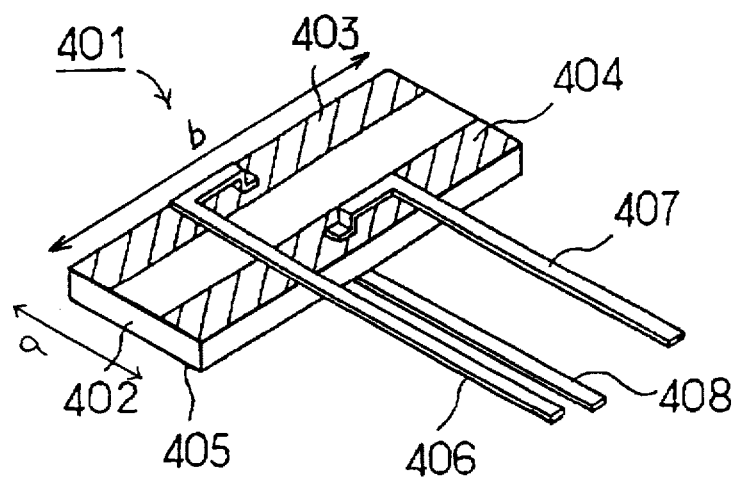
FIG. 27 is a perspective view of a piezoelectric resonator according to a twelfth preferred embodiment of the invention.

FIG. 27 is a perspective view of a piezoelectric filter 401 according to the twelfth preferred embodiment of the invention. The piezoelectric filter 401 is a single-mode piezoelectric filter.

The piezoelectric filter 401 includes a substantially rectangular piezoelectric ceramic plate 402. The cross section parallel to the top and bottom surfaces of the ceramic plate 402 has a substantially rectangular shape. The substantially rectangular shape is represented by a longer side having the length b and a shorter side having the length a. The ratio of the length b of each of the longer sides of the piezoelectric ceramic plate 402 to the length a of each of the shorter sides is preferably set to be within ±10% of the value satisfying Eq. (1) explained above.

A first resonant electrode 403 and a second resonant electrode 404 are formed on the top surface of the piezoelectric ceramic plate 402 along the edges of the longer sides. A common resonant electrode 405 is arranged to cover the whole bottom surface of the piezoelectric ceramic plate 402. Thus, the common resonant electrode 405 overlaps the two resonant electrodes 403 and 404 via the piezoelectric ceramic plate 402.

The piezoelectric ceramic plate 402 is polarized in a thickness direction i.e., in the direction perpendicular to top and bottom surfaces. A lead terminal 406 is soldered to the first resonant electrode 403. Another lead terminal 407 is soldered to the second resonant electrode 404. A further lead terminal 408 is soldered to the common resonant electrode located on the rear side.

In the piezoelectric filter 401, a first resonating portion is formed in the region where the first resonant electrode 403 overlaps the common resonant electrode 405 via the piezoelectric ceramic plate 402. Similarly, a second resonating portion is formed in the region where the second resonant electrode 404 overlaps the common resonant electrode 405. Thus, in the case where the first resonant electrode 403 and the second resonant electrode 404 are used as an input electrode and an output electrode, respectively, under the condition that the common resonant electrode 405 is connected to ground potential, the piezoelectric filter can be used as a single-mode piezoelectric filter.

In the piezoelectric filter 401, in order to prevent the resonance characteristics of the piezoelectric filter 401 from degrading, the lead terminals 406–408 are fixed to the resonant electrodes 403–405 in the region interconnecting substantially central points of the longer side surfaces of the piezoelectric ceramic plate 402, i.e., at the node. Therefore, the lead terminals 406–408 soldered to the electrodes does not degrade the resonance characteristics of the filter 401.

THIRTEENTH PREFERRED EMBODIMENT

Figure 28:
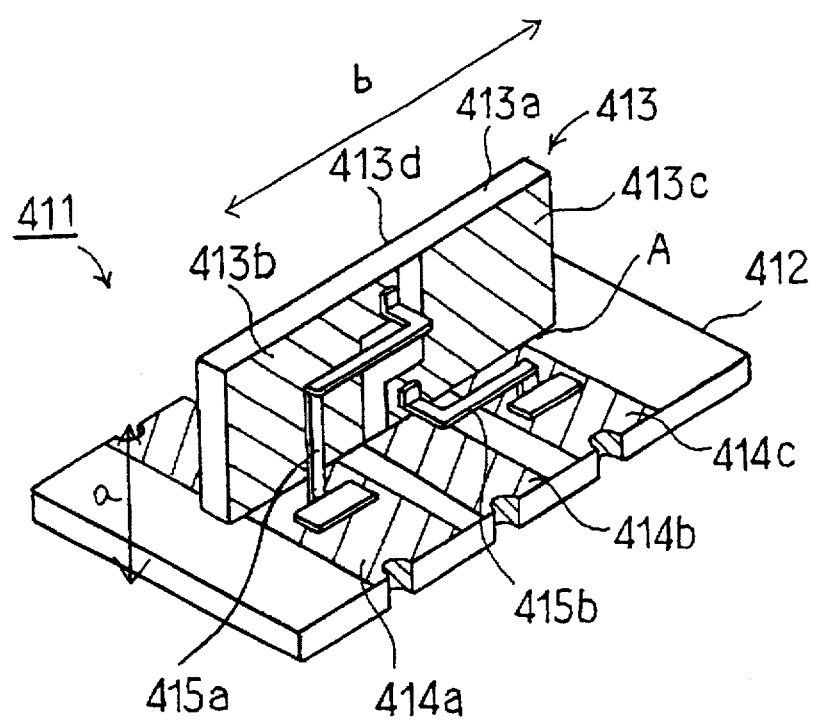
FIG. 28 is a perspective view of a piezoelectric resonant component according to a thirteenth preferred embodiment of the invention.

FIG. 28 is a perspective view of a piezoelectric filter according to the thirteenth preferred embodiment of the invention. The piezoelectric filter 411 includes a base plate 412 to which a piezoelectric filter element 413 is bonded. The base plate 412 is preferably made from an insulating ceramic such as alumina or from a synthetic resin. The base plate 412 shown in FIG. 28 has a substantially rectangular shape, but the shape of the base plate 412 is not limited to rectangular. Terminal electrodes 414a–414c are formed on the top surface of the base plate 412 and extend across the opposite longer sides.

The piezoelectric filter element 413 includes a substantially rectangular piezoelectric ceramic plate 413a, a resonant electrode located on one surface of the ceramic plate 413a, and a common resonant electrode 413d arranged to cover an entire area of the other surface. The resonant electrode is divided into a first resonant electrode 413b and a second resonant electrode 413c. The piezoelectric ceramic plate 413a is polarized in a thickness direction of the plate 413a. The cross section of the piezoelectric ceramic plate 413a taken parallel to both surfaces has a substantially rectangular shape. The ratio of the length b of each of the longer sides of the piezoelectric ceramic plate 413a to the length a of each of the shorter sides is preferably set to be within ±10% of the value satisfying Eq. (1).

The piezoelectric filter element 413 can be used as a single-mode piezoelectric filter by using the first resonant electrode 413b as an input electrode, using the second resonant electrode 413c as an output electrode, and connecting the common resonant electrode 413d to ground potential, in the same manner as the piezoelectric filter 401 shown in FIG. 27.

In piezoelectric filter 411, the piezoelectric filter element 413 is electrically connected with the connector terminals 414a–414c formed on the base plate 412. More specifically, the first resonant electrode 413b is electrically connected with the connector electrode 414a by a metal terminal 415a. Similarly, the second resonant electrode 413c is electrically connected with the connector electrode 414c by a metal terminal 415b. The common resonant electrode 413d is electrically connected with the connector electrode 414b by a further metal terminal (not shown).

The metal terminals 415a and 415b are designed so that the longer side surfaces of the piezoelectric filter element 413 can be spaced from the top surface of the base plate 412 via a given space A. That is, the longer side surface of the filter element 413 which is located on the lower side as viewed in FIG. 28 is not in contact with the top surface of the base plate 412. The metal terminals 415a, 415b and the metal terminal (not shown) connected with the common resonant electrode 413d are joined to their respective resonant electrodes at the node of the vibration of the piezoelectric filter element 413. Specifically, the node of the vibration of the filter element 413 is located along the direction interconnecting substantially central portions of the longer sides. Accordingly, in this region, the metal terminals 415a and 415b are joined to the resonant electrodes 413b and 413c, respectively.

As is apparent from the above-explanation, the metal terminals 415a and 415b are joined at the node of the vibration. Thus, the piezoelectric filter element 413 can be rigidly mounted to the base plate 412 without affecting the filter characteristics.

Figure 32:
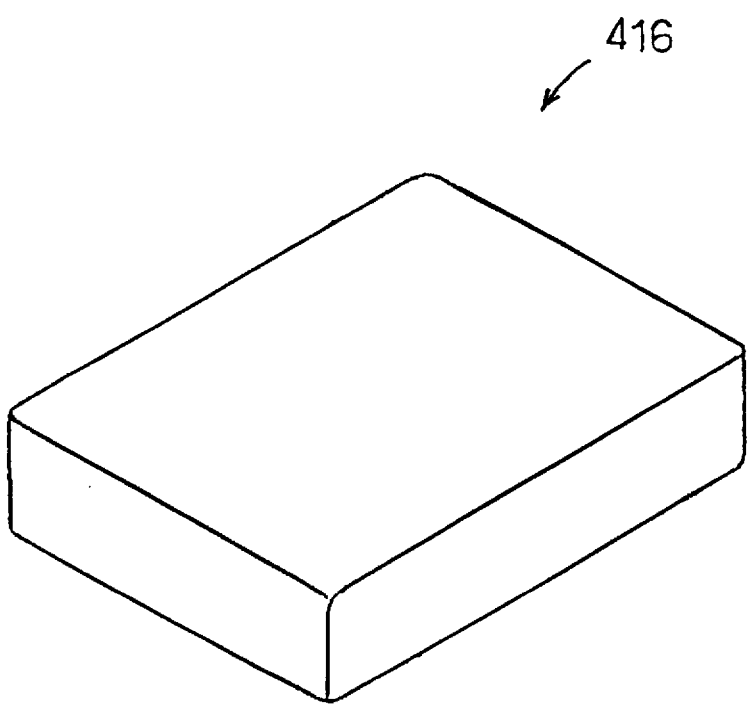
FIG. 32 is a perspective view of a cap used in the preferred embodiments of the present invention.

A cap 416 (FIG. 32) provided with an opening (not shown) on its lower side may be mounted on the base plate 412 so as to seal the piezoelectric filter element 413. This cap 416 can be made from an appropriate insulating material such as a ceramic or synthetic resin. The cap 416 can be bonded to the top surface of the base plate 412 via an insulating adhesive or the like.

FOURTEENTH PREFERRED EMBODIMENT

Figure 29:
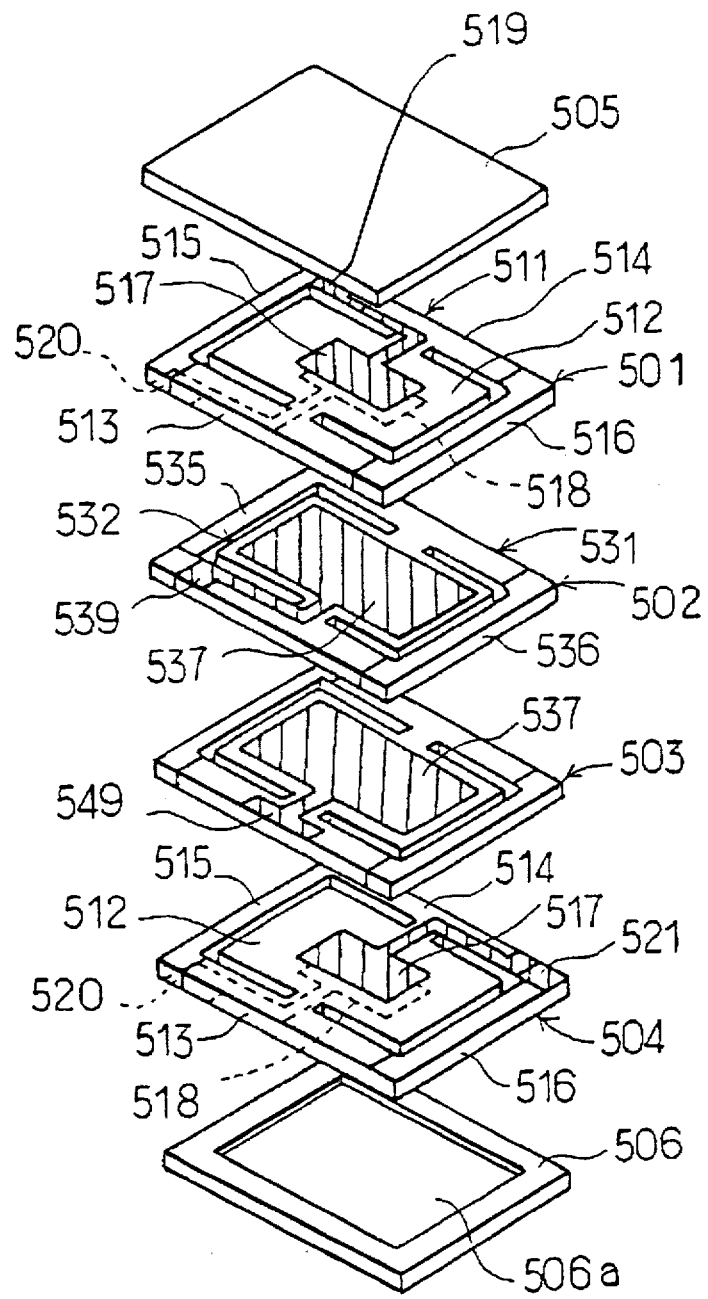
FIG. 29 is an exploded perspective view of a ladder-type filter according to a fourteenth preferred embodiment of the invention.
Figure 30:
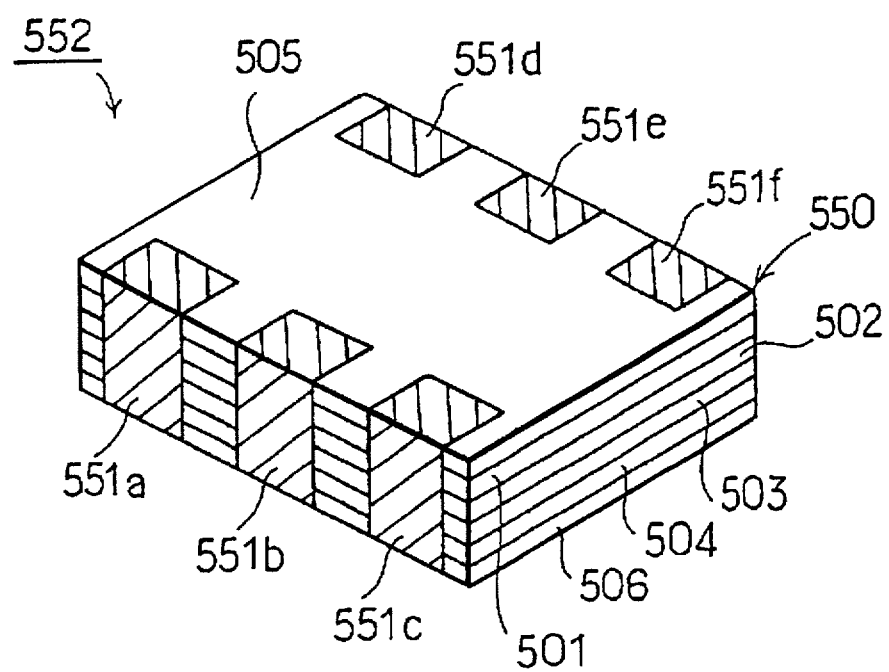
FIG. 30 is a perspective view of the ladder-type filter shown in FIG. 29.

FIG. 29 is an exploded perspective view of a ladder-type filter according to the fourteenth preferred embodiment of the invention. FIG. 30 is a perspective view of the ladder-type filter shown in FIG. 29.

The advantages of the preferred embodiments of the present invention can be applied to a ladder-type filter comprising a combination of plural resonators, as well as, to the above-described double-mode piezoelectric filter and single-mode piezoelectric filter. As shown in FIG. 29, in the ladder-type filter, resonant plates 501 to 504 and case bases 505, 506 are adhesively bonded together.

Each of the resonant plates 501 to 504 incorporates a piezoelectric resonator utilizing the certain width vibration mode according to the preferred embodiments of the present invention described above. Specifically, the resonant plate 501 includes a piezoelectric resonator 511 having a pair of holding portions 513 and 514, and first and second spacer plates 515 and 516. The piezoelectric resonator 511 includes a substantially rectangular piezoelectric ceramic plate 512 having a substantially rectangular shape. The holding portions 513 and 514 are connected to substantially central portions of the longer sides of the piezoelectric ceramic plate 512 via support portions. The spacer plates 515 and 516 are bonded to sides of the piezoelectric resonator 511.

The piezoelectric resonator 511 is similar in structure to the piezoelectric resonator described in connection with FIG. 15 except that resonant electrodes 517 and 518 formed on the top and bottom surfaces of the piezoelectric ceramic plate 512 have an area smaller than that of the entire surface of the piezoelectric ceramic plate 512. This reduces the electrostatic capacitance produced between the resonant electrodes 517 and 518.

The resonant electrode 517 is electrically connected with a connector electrode 519 extending to the outer end of the resonant plate 501. The resonant electrode 518 on the rear side extends out to a connector electrode 520 extending to the outer end of the resonator plate 501 on the rear side of the plate 501.

The cross section of the piezoelectric resonating portion 512 taken parallel to the top and bottom surfaces has a substantially rectangular shape including a pair of the longer sides b and a pair of the shorter sides a. The ratio of the length b of each of the longer sides of the piezoelectric resonating portion 512 to the length a of each of the shorter sides is preferably set to be within ±10% of the value satisfying Eq. (1). Consequently, the resonating portion is excited in the certain width vibration mode in the same way as the piezoelectric resonator already described in connection with FIGS. 10(a) and 10(b).

The resonant plate 504 is similar in structure with the above-described resonant plate 501. However, in the resonant plate 504, the connector electrode 521 to which the resonant electrode 517 formed on the top surface is electrically connected is located at a position different from the position of the connector electrode 519 formed on the top surface of the resonant plate 501 mentioned previously. The resonant plate 504 is similar to the resonant plate 501 in other respects. Since like components are indicated by like reference numerals, those components which have been already described will not be described below.

On the other hand, the resonant plate 502 located between the resonant plates 501 and 503 includes a piezoelectric resonator 531 to which first and second spacer plates 535 and 536, respectively, are coupled. The resonant plate 502 is similar to the resonant plate 501 up to this point. The difference between the resonant plate 502 and the resonant plate 501 is that the resonant electrode 537 formed on the top surface of the central piezoelectric resonating portion 532 and a resonant electrode (not shown) formed on the rear surface are larger than the resonant electrodes 517 and 518. This increases the electrostatic capacitance between the resonant electrode 537 of the resonator 531 and the resonant electrode (not shown) on the bottom surface. The resonant electrode 537 is electrically connected with the connector electrode 539 which extends to the outer end on the top surface of the resonant plate 502. This connector electrode 539 is located in a position so as to overlap the connector electrode 520 formed on the resonant plate 501 after they have been stacked on top of each other. The resonant electrode (not shown) on the bottom surface is electrically connected with the connector electrode which extends out to the center of the other longer side of the resonant plate 502.

The resonant plate 503 is similar to the resonant plate 502 described above except for the portions where connector electrodes are formed. That is, a connector electrode 549 electrically connected with the resonant electrode 537 on the top surface extends to the center of the edge of one of the longer side surfaces of the resonant plate 503. Another resonant electrode (not shown) on the bottom surface extends out to the position where the electrode overlaps the connector electrode 521 formed on the resonant plate 504.

A substantially rectangular recess 506a is formed in the top surface of the case base 506. Another recess (not shown) is formed in the bottom surface of the case base 505. The recess 506a is provided to define a space for preventing the vibration of the piezoelectric resonating portion inside the resonant plate 504 from being hindered. Instead of the recess 506a, a rectangular frame-like spacer may be formed to define the space.

The ladder-type filter is preferably fabricated by bonding together the resonant plates 501–504 via an insulating adhesive, stacking them on top of each other, and bonding the case bases 505 and 506 to the top and bottom sides, respectively, with an insulating adhesive, thus forming a lamination 550.

Moreover, as shown in FIG. 30, a two-stage ladder-type filter can be fabricated as a chip-type component by forming terminal electrodes 550a–550f on a side surface of the lamination 550. In this ladder-type filter 552, the terminal electrode 551a is used as an input electrode. The terminal electrode 551b is used as an output electrode. The terminal electrode 551c is connected to ground potential. The terminal electrodes 551e and 551f are connected to each other. In this way, the ladder-type filter can be operated.

In the ladder-type filter 552, all of the parallel and series resonators are formed by piezoelectric resonators utilizing the certain width vibration mode according to the preferred embodiments of the present invention. Hence, a chip-type, small-sized ladder-type filter adapted for use in the band from several hundreds of kilohertz to 2 MHz can be provided. Furthermore, the piezoelectric resonators are incorporated in the resonant plates 501–504, respectively. Consequently, the finished ladder-type filter 552 has improved impact resistance.

FIFTEENTH PREFERRED EMBODIMENT

Figure 31:
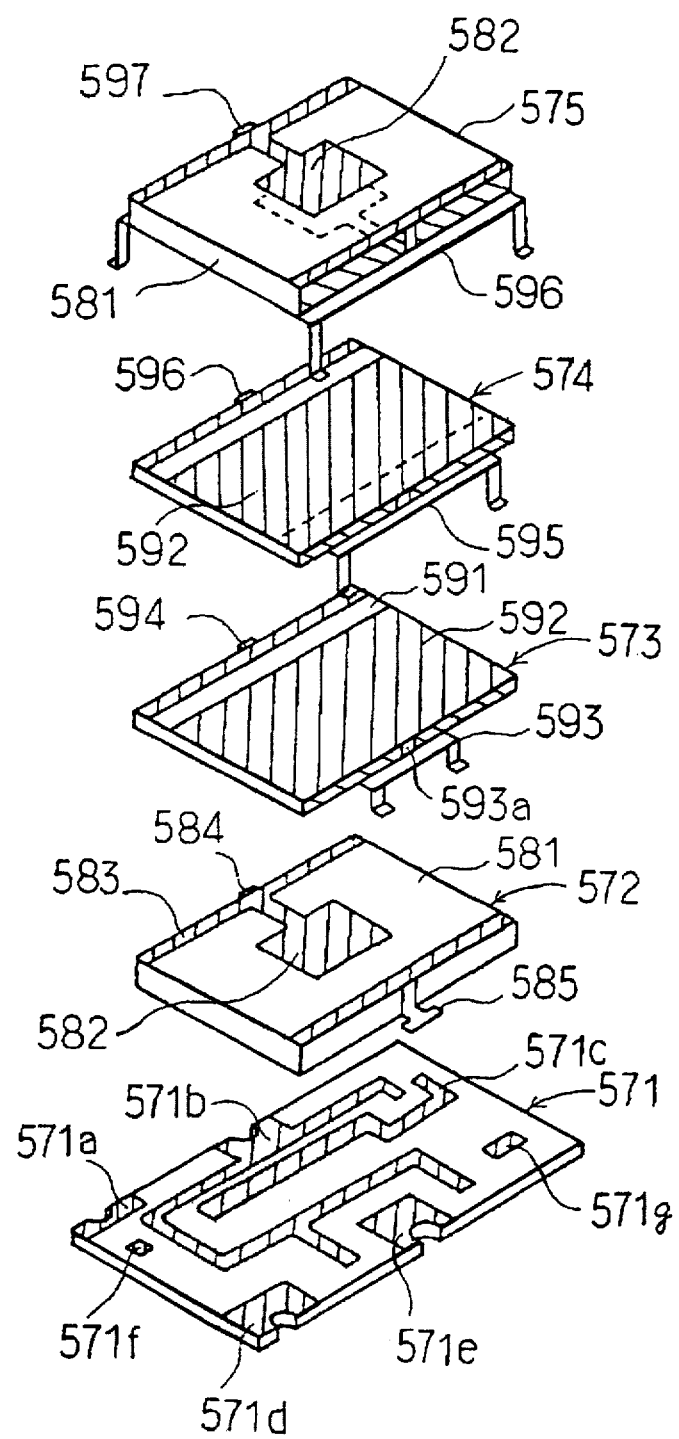
FIG. 31 is an exploded perspective view of a ladder-type filter according to a fifteenth preferred embodiment of the invention.

FIG. 31 is an exploded perspective view of a ladder-type filter according to the fifteenth preferred embodiment of the invention. In the ladder-type filter, all the series and parallel resonators are formed as resonant plates 501 to 504, respectively. The resonant plates are stacked on top of each other. Each of the piezoelectric resonators has only a piezoelectric resonating portion. Specifically, as shown in FIG. 31, piezoelectric resonators 572 to 575 are stacked with each other and mounted on a base plate 571. The resonators 572 and 575 are used as the series resonators of the ladder-type filter, while the resonators 573 and 574 are used as the parallel resonators.

A plurality of connector electrodes 571a to 571g are formed on the base plate 571 which is made from an appropriate material such as alumina or a synthetic resin.

The piezoelectric resonator 572 is first mounted on the base plate 571. The resonator 572 is preferably made of a substantially rectangular piezoelectric ceramic plate 581 which is polarized in a direction of thickness of the plate 581. The cross section parallel to the top and bottom surfaces forms a substantially rectangular cross section. The ratio of the length b of each of the longer sides to the length a of each of the shorter sides is preferably set to be within ±10% of the value satisfying Eq. (1) explained above.

A substantially rectangular resonant electrode 582 is formed in the center of the top surface of the piezoelectric ceramic plate 581. Another resonant electrode (not shown) overlapping the resonant electrode 582 is formed on the bottom surface. The resonant electrode 582 is electrically connected with a connector electrode 583 extending to one side of the top surface of the piezoelectric ceramic plate 581. A metal terminal 584 is joined to the center of the connector electrode 583 and similar in shape with the metal terminal 585. The resonant electrode (not shown) formed on the bottom surface is electrically connected with a connector electrode (not shown) formed on the bottom surface along the edges of the longer sides of the ceramic plate 581. The metal terminal 585 is preferably joined to the center of this connector terminal.

The dimensions of the metal terminals 584 and 585 taken in a certain direction are large enough to prevent the bottom surface of the piezoelectric resonator 572 from touching the top surface of the base plate 571. In this preferred embodiment, the metal terminal 585 has a first portion extending parallel to the longer side surfaces of the piezoelectric ceramic plate 581 and a second portion abutting against the top surface of the base plate 571 at the lower end of the first portion. The first portion extending parallel to the longer side surfaces of the piezoelectric plate 581 extends below the bottom surface of the piezoelectric ceramic plate 581. Accordingly, in the case where the portion of the lower end of the metal terminal 585 parallel to the base plate 571 is soldered to the base plate 571, the bottom surface of the piezoelectric resonator 572 is spaced by a desired distance from the base plate 571. Therefore, vibration of the resonator 572 is not hindered if the metal terminals 584 and 585 are joined to the plates. Furthermore, the terminals 584 and 585 are connected to the piezoelectric resonator 572 substantially in the centers of the longer side surfaces of the piezoelectric resonator 572. Consequently, if the resonator 572 is excited in the certain width mode, the resonant characteristics are affected by a very small amount, if at all, because of the securing structure comprising the metal terminals 584 and 585.

Similarly, the piezoelectric resonator 573 uses a substantially rectangular piezoelectric ceramic plate 591 which is polarized in a thickness direction of the plate 591. A resonant electrode 592 is formed on the top surface of the ceramic plate 591 and does not reach one longer side. The electrode 592 extends from the other longer side to the bottom surface through one side surface. A metal terminal 593 is joined and electrically connected to the resonant electrode 592. The terminal 593 has a joint portion 593a extending over its center. This joint portion 593a abuts against the center of the longer side surface of the piezoelectric ceramic plate 591.

A second resonant electrode is formed on the bottom surface of the piezoelectric ceramic plate 591 and does not reach to the other longer side. The second resonant electrode extends from one longer side to the top side across one side surface. The second resonant electrode is electrically connected with the resonant electrode on the rear side on the side surface opposite to the longer side to which the metal terminal 593 is joined.

Also in the piezoelectric resonator 573, when a voltage is applied between the resonant electrodes on both surfaces, the resonator is excited in the certain width mode according to the preferred embodiments of the present invention. The node of the vibration exists in the region interconnecting the centers of the longer side surfaces of the piezoelectric ceramic plate 591. However, the metal terminals 593 and 594 are electrically connected with the resonant electrode 592 and with the resonant electrodes (not shown) on the underside at the node of the vibration. Hence, the resonant characteristics of the piezoelectric resonator 573 are hardly affected if the metal terminals 593 and 594 are joined.

The metal terminals 593 and 594 are shaped so that they do not touch the underlying piezoelectric resonator 572 or the metal terminals 584, 585. Those portions of the bottoms of the metal terminals 593 and 594 which are parallel to the base plate 571 are electrically connected with the connector terminal on the base plate 571.

The piezoelectric resonator 574 is similar to the above-described piezoelectric resonator 573 except that the portions of the metal terminals 595 and 596 which are joined to the base plate 571 are located close to both ends of the longer sides to prevent these portions from coming into contact with the underlying metal terminals 593 and 594.

The uppermost piezoelectric resonator 575 is similar to the piezoelectric resonator 572 except that the metal terminals 596 and 597 are located at both ends of the longer side surfaces of the piezoelectric ceramic plate 581 to prevent the metal terminals 596 and 597 from coming into contact with the underlying other metal terminals.

In the present preferred embodiment, the piezoelectric resonators 572–575 are joined to the base plate 571 with the metal terminals 584–596. Thus, a two-stage ladder-type filter similar to the ladder-type filter of the fourteenth preferred embodiment can be fabricated. A cap, for the present preferred embodiment, which is similar to the cap shown in FIG. 32, can be bonded to the base plate 571. The piezoelectric resonators 572–575 are sealed in the cap. In this way, a ladder-type filter having excellent sealing characteristics can be obtained.

Also in the present preferred embodiment, the piezoelectric resonators 572–575 are joined to and held by the metal terminals, using substantially central portions of the longer side surfaces. Therefore, the piezoelectric resonators 572–575 can exhibit desired resonant characteristics. In addition, the piezoelectric resonators 572–575 are only electrically connected with the connector electrodes on the base plate 571 with the metal terminals. The support members and the holding portions used in the fourteenth preferred embodiment can be eliminated. Consequently, a smaller ladder-type filter can be provided.

In the above preferred embodiments, the vibrating body is made from a piezoelectric ceramic. However, any arbitrary material can be used as long as it shows piezoelectricity. Examples include quartz, a piezoelectric single crystal of $LiTaO_3$, $LiNbO_3$, or the like, and high-polymers exhibiting piezoelectricity. Furthermore, a piezoelectric material may be formed on a semiconductor or metal plate which itself does not exhibit piezoelectricity, and this lamination is operated like the above-described piezoelectric body. In this case, it is necessary to take account of the Poisson ratio σ of the whole resonating portion.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A resonator comprising:

a resonating portion which has a substantially rectangular cross-sectional shape including a pair of shorter sides each having a length a and a pair of longer sides each having a length of b, the resonating portion being made from a material having a Poisson ratio σ, wherein a ratio of the length b to the length a is within ±10% of a value given by $$b/a = n(-2.70\sigma + 2.86) \qquad (1)$$

where n is an integer.

2. A resonator according to claim 1, wherein the resonating portion having the substantially rectangular cross section comprises a piezoelectric resonating portion including a piezoelectric body and a plurality of resonant electrodes located on an outer surface of the piezoelectric body.

3. A resonator according to claim 2, further comprising a support member connected with a substantially central portion of a side surface of at least one of the longer sides of the resonating portion.

4. A chip-type piezoelectric resonant component comprising:

a resonating portion which has a substantially rectangular cross-sectional shape including a pair of shorter sides each having a length a and a pair of longer sides each having a length of b, the resonating portion being made from a material having a Poisson ratio σ, wherein a ratio of the length b to the length a is within ±10% of a value given by $$b/a = n(-2.70\sigma + 2.86) \qquad (1)$$

where n is an integer;

a support member connected with a substantially central portion of a side surface of at least one of the longer sides of the resonating portion;

a plurality of case members connected to top and bottom surfaces of the resonator so that the resonator is held between the case members; and at least one space-forming member provided in each of the case members or between each case member and the resonator to define space for preventing vibration of a vibrating portion of the resonator from being hindered.

5. A chip-type piezoelectric resonant component according to claim 4, wherein the space forming members comprise first and second spacer plates cooperating with the resonator to form a frame-like resonant plate provided with a substantially centrally located opening, the spacer plates being mounted on the support member of the resonator, and wherein the case members are connected to top and bottom surfaces of the resonant plate.

6. A double-mode piezoelectric filter comprising:

a resonating portion having a substantially rectangular cross-sectional shape having a pair of shorter sides each having a length a and a pair of longer sides each having a length b, the resonator being made from a material having a Poisson ratio of σ, wherein a ratio of the length b to the length a is set to be within +10% of a value given by $$b/a = n(-2.70\sigma + 2.86) \qquad (1)$$

where n is an integer;

the resonating portion having first and second piezoelectric resonating portions including support members connected to a substantially central portion of one side surface of the longer sides, substantially central portions of other side surfaces of the longer sides of the first and second piezoelectric resonating portions being connected together by a connector member;

the first and second piezoelectric resonating portions comprising piezoelectric bodies having top surfaces;

first and second resonant electrodes respectively disposed on the top surfaces of the piezoelectric bodies; and a common resonant electrode disposed on bottom surfaces of the first and second piezoelectric resonating portions so as to overlap the first and second resonant electrodes via the piezoelectric bodies, respectively.

7. A chip-type double-mode piezoelectric filter device comprising:

a resonating portion having a substantially rectangular cross-sectional shape having a pair of shorter sides each having a length a and a pair of longer sides each having a length b, the resonator being made from a material having a Poisson ratio of σ, wherein a ratio of the length b to the length a is set to be within 10% of a value given by $$b/a = n(-2.70\sigma + 2.86) \qquad (1)$$

where n is an integer;

the resonating portion having first and second piezoelectric resonating portions including support members connected to a substantially central portion of one side surface of the longer sides, substantially central portions of other side surfaces of the longer sides of the first and second piezoelectric resonating portions being connected together by a connector member;

the first and second piezoelectric resonating portions comprising piezoelectric bodies having top surfaces;

first and second resonant electrodes respectively disposed on the top surfaces of the piezoelectric bodies;

a common resonant electrode disposed on bottom surfaces of the first and second piezoelectric resonating portions so as to overlap the first and second resonant electrodes via the piezoelectric bodies, respectively;

first and second spacer plates mounted on the support members and cooperating with the double-mode piezoelectric filter to form a frame-like resonant plate provided with a substantially centrally located opening; and a plurality of case members being connected to top and bottom surfaces, respectively, of the resonant plate.

8. A single-mode piezoelectric filter comprising:

a resonating portion having a substantially rectangular cross-sectional shape having a pair of shorter sides each having a length a and a pair of longer sides each having a length b, the resonator being made from a material having a Poisson ratio of σ, the resonating portion being arranged such that a ratio of the length b of each of the longer sides to the length a of each of the shorter sides is set to be within +10% of a value given by $$b/a = n(-2.70\sigma + 2.86) \tag{1}$$

where n is an integer; and the resonating portion comprising a piezoelectric plate, first and second piezoelectric electrodes disposed on a top surface of the piezoelectric plate along edges of the longer sides, and a common resonant electrode disposed on a bottom surface of the piezoelectric plate so as to overlap the first and second resonant electrodes via the piezoelectric plate.

9. A chip-type single-mode piezoelectric filter device comprising:

a base plate having a top surface on which a plurality of connector electrodes for connection with external electronic components are disposed;

a resonating portion having a substantially rectangular cross-sectional shape having a pair of shorter sides each having a length a and a pair of longer sides each having a length b, the resonator being made from a material having a Poisson ratio of σ, the resonating portion being designed in such a way that a ratio of the length b of the longer sides to the length a of the shorter sides is set to be within +10% of a value given by $$b/a = n(-2.70\sigma + 2.86) \tag{1}$$

where n is an integer;

the resonating portion comprising a piezoelectric plate, first and second piezoelectric electrodes disposed on a top surface of the piezoelectric plate along edges of the longer sides, and a common resonant electrode disposed on a bottom surface of the piezoelectric plate so as to overlap the first and second resonant electrodes via the piezoelectric plate the single-mode piezoelectric filter being located on the base plate in such a way that one of the longer side surfaces faces downward;

a plurality of terminals for electrically connecting the first and second resonant electrodes and the common resonant electrode of the piezoelectric filter with the connector terminals, respectively, and for mounting the resonator on the base plate; and a cap member mounted to the base plate so as to surround the resonator mounted on the base plate.

10. A ladder-type filter comprising:

at least one parallel piezoelectric resonator forming a parallel arm;

at least one series piezoelectric resonator forming a series arm, wherein at least one of the series resonator and parallel resonator comprises:

a resonating portion which has a substantially rectangular cross-sectional shape including a pair of shorter sides each having a length a and a pair of longer sides each having a length of b, the resonating portion being made from a material having a Poisson ratio σ, wherein a ratio of the length b to the length a is within ±10% of a value given by $$b/a = n(-2.70\sigma + 2.86) \tag{1}$$

where n is an integer; and wherein the resonating portion having the substantially rectangular cross section comprises a piezoelectric resonating portion including a piezoelectric body and a plurality of resonant electrodes located on an outer surface of the piezoelectric body.

11. The ladder-type filter of claim 10, further comprising:

a base plate having a top surface on which a plurality of connector electrodes for connection with external electronic components are disposed;

a plurality of terminals; and a cap, wherein the parallel piezoelectric resonator and the series piezoelectric resonator are stacked on the base plate, the resonant electrodes of the parallel piezoelectric resonator and the series piezoelectric resonator are electrically connected to the plurality of connector electrodes via the plurality of terminals so that the parallel piezoelectric resonator and the series piezoelectric resonator form a ladder-type filter and are fixed on the base plate, and the cap is mounted to the base plate so as to surround the parallel piezoelectric resonator and the series piezoelectric resonator.

12. The ladder-type filter of claim 11, wherein the terminals are joined to the parallel piezoelectric resonator and the series piezoelectric resonator in a region interconnecting substantially central portions of the longer side surfaces of the parallel piezoelectric resonator and the series piezoelectric resonator.

13. A ladder-type filter comprising:

at least one parallel piezoelectric resonator forming a parallel arm;

at least one series piezoelectric resonator forming a series arm, wherein at least one of the series piezoelectric resonator and parallel piezoelectric resonator;

a resonating portion which has a substantially rectangular cross-sectional shape including a pair of shorter sides each having a length a and a pair of longer sides each having a length of b, the resonating portion being made from a material having a Poisson ratio σ, wherein a ratio of the length b to the length a is within ±10% of a value given by $$b/a = n(-2.70\sigma + 2.86) \tag{1}$$

where n is an integer; and a support member connected with a substantially central portion of a side surface of at least one of the longer sides of the resonating portion.

14. The ladder-type filter of claim 13, further comprising:

first and second spacer plates fixed to the support member of the piezoelectric resonator so that the support member and the first and second spacer plates form a frame-like resonant plate provided with a substantially centrally located opening for the piezoelectric resonator;

a plurality of case members; and at least one space-forming member, wherein the parallel piezoelectric resonator and the series piezoelectric resonator are stacked to form a stacked structure, the case members are bonded to top and bottom surfaces of the stacked structure to secure spaces to prevent vibration of vibrating portions of the piezoelectric resonators from being hindered, and the at least one space-forming member is located in the case members or between the case members and the resonant plates to define spaces to prevent vibration of vibrating portions of the resonators from being hindered.

* * * * *